US006399878B2

(12) United States Patent
Kondo et al.

(10) Patent No.: US 6,399,878 B2
(45) Date of Patent: Jun. 4, 2002

(54) SOLID CABLE, MANUFACTURING METHOD THEREOF, AND TRANSMISSION LINE THEREWITH

(75) Inventors: Mamoru Kondo; Ryosuke Hata; Hiroshi Takigawa; Jun Yorita; Takahiro Horikawa; Yuichi Ashibe; Morihiro Seki, all of Osaka (JP)

(73) Assignee: Sumitomo Electric Industries, Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/243,450

(22) Filed: Feb. 3, 1999

(30) Foreign Application Priority Data

Feb. 3, 1998 (JP) .......................................... 10-038173

(51) Int. Cl.[7] .................................................. H10B 9/06

(52) U.S. Cl. ..................................................... 174/25 R

(58) Field of Search ............................ 174/14 R, 25 R, 174/25 C, 120 R, 120 C, 12 OFP, 120 SC; 252/567, 570

(56) References Cited

U.S. PATENT DOCUMENTS

| | | | | |
|---|---|---|---|---|
| 3,749,812 A | * | 7/1973 | Reynolds et al. | 174/25 R |
| 4,224,462 A | * | 9/1980 | Occhini et al. | 174/25 R X |
| 4,234,754 A | * | 11/1980 | Edwards et al. | 174/14 R |
| 4,329,536 A | | 5/1982 | Sato et al. | 174/25 R |

(List continued on next page.)

FOREIGN PATENT DOCUMENTS

| | | |
|---|---|---|
| EP | 0 843 320 A | 5/1998 |
| JP | 60-59610 | 4/1985 |
| JP | 61-10811 | 1/1986 |
| JP | 61-26168 | 6/1986 |
| JP | 62-44904 | 2/1987 |
| JP | 3-171513 | 7/1991 |
| JP | 10-12054 | 1/1998 |
| JP | 10-199338 | 7/1998 |

OTHER PUBLICATIONS

"Study of Polypropylene–Laminated Paper for Extra–High Voltage (EHV) and Ultra–High Voltage (UHV) of Cables", Papers of The Institute of Electrical Engineering of Japan [52–A53 (1977, vol. 97, No. 8)], pp. 403 to 410.

(List continued on next page.)

*Primary Examiner*—Ghau N. Nguyen
(74) *Attorney, Agent, or Firm*—McDermott, Will & Emery

(57) ABSTRACT

A cable and cable system is provided having a conductor and an insulation layer on an outer circumference of a conductor. The insulation layer is impregnated with a medium-viscosity insulating oil that has a viscosity of 10 centistokes (cst) to less than 500 cst at 60° C. The insulation layer includes an insulating tape that may be one or a combination of composite tape having a polyolefin resin film laminated with a kraft paper on both its sides and an insulating tape including a polyolefin resin film. The cable includes a metal sheath provided on an outer circumference of the insulation layer, and a reinforcing layer formed on an outer circumference of the metal sheath. The reinforcing layer reinforces the metal sheath by absorbing hoop stress exerted on the metal sheath. The cable system includes a submarine-portion cable and a land-portion cable, an oil stop joint box, and an oil feeding tank. The oil stop joint box connects the submarine-portion cable to the land-portion cable, and the oil feeding tank is connected to the land-portion cable which feeds the medium-viscosity insulating oil to the land-portion cable.

30 Claims, 11 Drawing Sheets

U.S. PATENT DOCUMENTS

| | | | | | |
|---|---|---|---|---|---|
| 4,701,016 | A | * | 10/1987 | Gartside, III et al. | 174/110 SR X |
| 4,704,170 | A | * | 11/1987 | Priaroggia | 174/25 R X |
| 4,853,490 | A | * | 8/1989 | Bosisio | 174/25 R |
| 4,994,632 | A | * | 2/1991 | Bosisio et al. | 174/25 R X |
| 5,481,070 | A | * | 1/1996 | Hirose et al. | 174/120 FP |
| 5,850,055 | A | * | 12/1998 | Bosisio et al. | 174/25 R |
| 5,865,212 | A | * | 2/1999 | Gaines | 137/599 |

OTHER PUBLICATIONS

Patent Abstracts of Japan, vol. 017, No. 411 (E–1406), Jul. 30, 1993 & JP 05 081937 A (Sumitomo Electric Ind Ltd), Apr. 2, 1993, 1 page.

Patent Abstracts of Japan, vol. 003, No. 082 (E–123), Jul. 13, 1979 & JP 54 060482 A (Furukawa Electric Co Ltd: The), May 15, 1979, 1 page.

Patent Abstracts of Japan, vol. 017, No. 307 (E–1379), Jun. 11, 1993 & JP 05 028833 A (Nippon Petrochem Co Ltd), Feb. 5, 1993, 1 page.

Patent Abstracts of Japan, vol. 098, No. 014, Dec. 31, 1998 & JP 10 255550 A (Fujikura Ltd), Sep. 25, 1998, 1 page.

Patent Abstracts of Japan, vol. 098, No. 013, Nov. 30, 1998 & JP 10 208550 A (Fujikura Ltd), Aug. 7, 1998, 1 page.

* cited by examiner

SOLID CABLE, MANUFACTURING METHOD THEREOF, AND TRANSMISSION LINE THEREWITH

BACKGROUND OF THE INVENTION

1. Field of the Invention

The present invention relates to a power cable which is optimum for long-distance and bulk power transmission, and particularly to a structure and a method of manufacturing for a power cable for DC submarine transmission and a submarine transmission line using such power cables.

2. Description of the Related Art

Conventionally, a solid cable (Mass-Impregnated Cable or Non-Draining Cable) using kraft paper as insulating tape material and impregnated with high-viscosity insulating oil (for example, 25 to 100 cst at 120° C., and 500 to 2,000 cst at the maximum service temperature of the cable (50 to 60° C.)) has been used as a long-distance and bulk power DC cable.

To attain a solid cable of a larger capacity, it will do to make the solid cable withstand a higher voltage and allow a larger current. A large current solid cable can be realized if a conductor having a sectional area as large as possible is used or the maximum service temperature of the conductor is made to be as high as possible. On the other hand, making the voltage of the cable high and making the service temperature high depend on the performance of an insulation. They cannot be realized unless a new technique is developed.

Recently, in order to transmit bulk power which has been impossible or difficult to be realized in a conventional solid cable with kraft paper insulation, a solid cable using polyolefin resin film as at least a part of insulating material is proposed. Investigation has been conducted on the proposed cable which can be used, for example, under a high voltage of DC 500 kV or higher, or at the conductor maximum service temperature of 60° C. or higher (for example, around 80° C.).

However, insulating oil used in this case is a high-viscosity insulating oil which has been used in a conventional solid cable. This is because the insulating oil of the cable impregnated in a factory has been thought to be necessary to avoid, along the whole cable line, uneven oil-distribution or oil-starvation caused by migration in order that the electric characteristic is prevented from deterioration in any condition. That is, particularly in the case of a long-distance submarine solid cable, the cable line is too long to feed or absorb insulating oil at its both ends. It has been therefore considered that only high-viscosity oil enough not to produce migration even at the maximum service temperature of the cable (usually 55° C. or lower) can be used.

However, the following problems arise as conspicuous hurdles for making both service voltage and service temperature of the conventional solid cables high to ensure the large capacity thereof.

When current load is OFF after the conductor takes the maximum temperature in the state of load ON period, the temperature near the conductor drops down sharply so that the contraction of the insulating oil near the conductor is caused. Since the high-viscosity oil cannot move sufficiently rapidly from the outside of the insulating wall to the inside thereof, sometimes starvation of the insulating oil occurs near the conductor which may produce voids so that such voids are thereby likely to reduce the electric performance conspicuously.

That is, as the maximum service temperature of the conductor is attempted to make higher, (1) the treatment of the insulating oil becomes more difficult because the amount of the expansion and contraction of the insulating oil is increased, and (2) it becomes more necessary to take measures against the easiness of migration because of lowering of the viscosity of the insulating oil. In addition, the temperature at the time of load OFF drops down more sharply to thereby cause severe oil-starvation so that large voids are apt to be generated. Therefore, there is a problem that high electric stress cannot be applied to the cable insulation thoughtlessly.

Further, it has been tried to make an application of polyolefin resin film or a composite insulating tape of polyolefin resin film and kraft paper. However, in comparison with kraft paper consisting of porous natural wood pulp fiber, polyolefin resin film has no pores through which liquid can flow so that high-viscosity insulating oil are not allowed to pass. Therefore, when a cable core is impregnated with insulating oil in a factory with high-viscosity insulating oil, there arises a very serious situation that the impregnation of insulating oil becomes insufficient or impossible, or even if possible very hard to fully implement for an industrially reasonable process time, as the insulation layer is thicker. As a result, it could be hardly done to improve the industrial productivity or to increase the ratio of the polyolefin resin film in the composite insulating tape in order to achieve the expected purpose.

SUMMARY OF THE INVENTION

It is an object of the present invention to provide a solid cable in which the voltage can be made high and the service temperature thereof can be increased so that very large bulk power transmission can be realized.

It is another object of the present invention to provide a method of manufacturing such a solid cable and a transmission line using such solid cables.

The present invention is intended to solve the foregoing problems, and its characteristic is using medium-viscosity insulating oil as the insulating oil in a solid cable.

The term "medium-viscosity insulating oil" herein means insulating oil the viscosity of which is not less than 10 centistokes (cst) and less than 500 centistokes (cst), at 60° C. Particularly, the SP value (Solubility Parameter) of the insulating oil is preferably within a range of ±1.5 of the SP value of polyolefin resin film used in an insulation layer. Examples of the medium-viscosity insulating oil include polystyrene insulating oil, polybutene, mineral oil, synthetic oil mainly composed of alkylbenzene, heavy alkylate, or a mixture containing at least one of these oils. Particularly, it is preferable to contain dodecylbenzene (DDB).

It is preferable to use a tape containing polyolefin resin film as at least a part of an insulation layer of a cable according to the present invention. The tape containing polyolefin resin film includes a composite tape laminated with kraft paper on one side or both sides of polyolefin resin film, as well as an insulating tape consisting of polyolefin resin film singly. Particularly, it is preferable that a composite tape laminated with kraft paper on both sides of polyolefin resin film and an insulating tape consisting of polyolefin resin film singly are wound alternately to thereby form the insulation layer.

It is also preferable that at least one of ρ(resistivity)-grading or ε(permittivity)-grading is formed in the insulation layer. For example, a composite tape laminated with kraft paper on both sides of polyolefin in resin film is used as the insulating tape, and the ratio of the thickness of the polyolefin resin film to the total thickness of the insulating tape is changed to thereby form the grading. Not to say, the composite insulating tape used here may include an insulating tape in which the thickness of kraft paper is zero, that is, which consists of only the polyolefin resin film.

Further, when a composite tape laminated with kraft paper on both sides of polypropylene film (PPLP) is used as the insulation layer, it is suitable to make the ratio of the thickness of the polypropylene film to the total thickness of this composite tape not less than 40% and less than 90%. Particularly, it is more preferable that this ratio is set to exceed 60%.

Generally, a metal sheath (usually a lead sheath) is provided on the outer circumference of an insulation layer of a solid cable. It is also preferable to form a reinforcing tape layer on the outer circumference of this metal sheath. This reinforcing tape layer has a function to have its share against hoop stress (stress generated inside the metal sheath by oil pressure to break the metal sheath) exerted on the metal sheath to thereby reinforce the metal sheath. Therefore, it is preferable to select the material of the reinforcing type layer from the materials which can obtain a high tensile strength, for example, from polyamide, polyimide resin tape (trade name; Kevlar), etc. as well as a metal tape such as stainless steel.

As for the method of manufacturing a solid cable according to the present invention, the above-mentioned medium-viscosity insulating oil may be impregnated in a conventional method as it is. In addition, the method of manufacturing a solid cable according to the present invention comprises the steps of: impregnating an insulation layer with low-viscosity insulating oil the viscosity of which is not more than 10 centistokes (cst) at a room temperature; deoiling the insulation layer to remove the low-viscosity insulating oil; and then impregnating the insulation layer with medium-viscosity insulating oil the viscosity of which is not less than 10 centistokes (cst) and less than 500 centistokes (cst) at 60° C. Also in this case, it is preferable that the SP value of the medium-viscosity insulating oil is within a range of ±1.5 of the SP value of polyolefin resin.

Further, the transmission line according to the present invention comprises a submarine-portion solid cable laid on the bottom of the sea which is constituted by the above-mentioned solid cable according to the present invention, and land-portion cables connected to both ends of the submarine-portion solid cable through oil-stop joint boxes respectively, the oil-stop joint boxes being disposed on shore portions, oil feeding tanks being connected to the land-portion cables for feeding insulating oil having medium or lower viscosity to the land-portion cables.

Here, the land-portion cables may be solid cables or OF cables (Self-Contained Oil-Filled Cables). Insulating oil the viscosity of which is medium or lower is supplied from the oil feeding tanks when the land-portion cables are solid cables, and low-viscosity insulating oil is supplied in the case of the OF cables. In addition, the above-mentioned transmission line is preferably configured in the manner that oil feeding pipes are connected to the oil-stop joint boxes at their submarine-portion solid cable sides, and the oil feeding pipes are coupled with the oil feeding tanks so as to feed medium-viscosity insulating oil from the oil feeding tanks to the submarine-portion solid cable. Further, more preferably, a check valve is provided in this oil feeding pipe so as to make the medium-viscosity insulating oil flow only toward the oil-stop joint box.

DETAILED DESCRIPTION OF THE INVENTION

Figure 1:
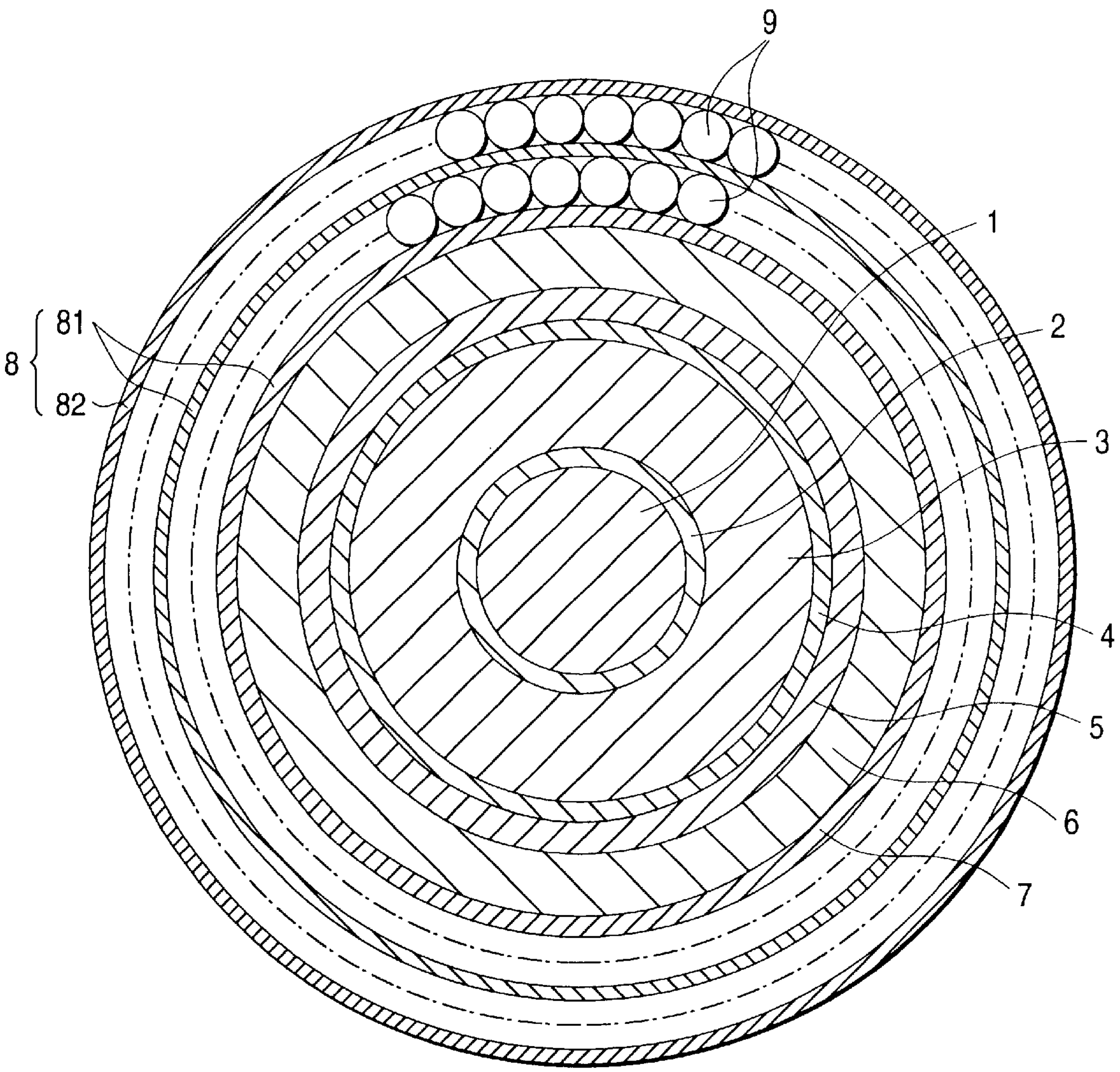
FIG. 1 is a sectional view of a submarine solid cable.

Detailed description of the present invention, including the details to reach the present invention, will be described below.

A submarine cable suffers the sea-water pressure from its outside toward its inside in proportion to the depth of the sea after it is laid. Generally, the pressure which increases at the rate of 1 kg/cm$^2$ per 10 m depth is applied to the cable from its outside toward its inside. For example, when the inside of metal sheath of the submarine cable is filled with low-viscosity insulating oil as is common with an OF cable, enough fluidity is ensured for the insulating oil. That is, the pressure of the oil can be propagated from outside to inside of the cable through the oil entirely in a sufficiently short time. Therefore, the pressure obtained by multiplying the difference in specific gravity between the sea water and the low-viscosity insulating oil by "the rate of 1 $kg/cm^2$ per 10 m depth" is applied to the cable from its outside toward its inside.

As for the oil pressure applied to the insulation which determines the electric performance of the insulation, the pressure obtained by multiplying the specific gravity of the oil by "the rate of 1 $kg/cm^2$ per 10 m depth" is applied uniformly as internal oil pressure. Therefore, it is possible to easily obtain high oil pressure to thereby ensure stable electric performance easily in an OF cable.

On the other hand, in a solid cable filled with insulating oil the viscosity of which is extremely high, the fluidity of the insulating oil is contrarily not enough so that the insulating oil shows discontinuity. That is, even if the pressure of the oil changes in a certain portion, the pressure change in the portion is hardly or not at all propagated to the rest of the oil in a sufficiently short time. Alternatively, even if a portion of the oil flows, the rest of the oil hardly or does not at all follow the flow of the portion in a sufficiently short time. Accordingly, it is inferred that the cable suffers the water pressure in proportion to the depth of the sea water from the outside toward the inside substantially as it is, as if a solid bar suffered external sea-water pressure by 100%.

In addition, because of the above-mentioned discontinuity of insulating oil, the oil pressure in the insulation itself could not be increased in proportion to the depth of water. Accordingly, it was considered that the cable had to be put in service under the service conditions that the electric performance in every portion of the cable can be maintained by the insulating oil with which the insulation was impregnated sufficiently in every portion of the cable. Therefore, the service temperature was limited to about 55° C. or less, and the operating voltage was limited to 450 kV or less. In addition, CDVC (Cable Dependent Voltage Control) or the like had to be adopted when load was switched off. CDVC is a special operation system in which when load is to be switched off (or reduced), the operating voltage is reduced in a sufficiently long time before the operation of the load switching-off (or reduction) is effected. Therefore, the electric stress applied to voids which will be generated in an insulation layer near a conductor upon the load switching-off is reduced and then the load is really switched off (or reduced). However, this operating system becomes a large obstacle in view of free operation.

On the other hand, sudden temperature drop when load is switched OFF in the state of full load, and oil starvation in the insulation layer near the conductor caused by the oil contraction due to the temperature drop are main concerns. In order to compensate the reduction of oil pressure near the conductor produced when load is switched OFF, it is preferable that the internal oil pressure in that portion is made high enough from the first, and then the oil pressure in that portion is reduced so as to make the volume in that portion expand correspondingly to the reduction of the volume in that portion caused by temperature drop so that the reduction of the volume in that portion can be compensated. Then, the insulating oil needs to move from the outside of the insulation layer, in which the oil pressure is high, to the inside quickly enough so as to compensate the reduction of oil pressure in the inside. In such a manner, starvation can be prevented from occurring. To this end, it is preferable that the viscosity of the insulating oil used here is low enough to keep the continuity of flow of the oil, or the viscosity is as low as possible even in the case of a solid cable insulating oil.

In addition, the continuity of oil flow and the easiness in movement of the oil from the outside to the inside depend on the magnitude of the fluid resistance (oil flow resistance) of the insulation against the oil. In an insulation layer including resin film which does not allow the insulating oil to pass, the insulating oil cannot flow without bypassing the resin film tape. Accordingly, the oil flow resistance becomes inevitably higher than that of a kraft paper insulation layer. Therefore, in a solid cable including such a resin film in an insulation, it is preferable to use insulating oil the viscosity of which is as low as possible, not only to enable the insulating oil to permeate but also to compensate the reduction of oil pressure near a conductor when load is switched OFF.

Based on the basic consideration as mentioned above, the present inventors have investigated the development of a solid cable using insulating oil satisfying the flowing items.

<Index Concerned with the Lowness of Insulating Oil Viscosity>

(1) The viscosity is required to be low enough to an extent so as to carry out the impregnation satisfactorily easily, even in the case of adopting an insulation layer including a composite tape composed of polyolefin resin film and kraft paper, or a polyolefin resin film tape the surface of which has been treated with embossing (see Examined Japanese Patent Application Publication No. Toku Kou Sho-61-26168). Particularly in the case of the composite tape, it is required so that the impregnation of the insulation oil can be done satisfactorily even if the thickness ratio of the polyolefin resin film is about 80%.

(2) The viscosity is required to be low enough to an extent so as not to produce negative pressure upon load switching off under the effect of the sea-water pressure in the depth of about 100 m or more.

(3) The viscosity is required to be low enough to an extent so as to avoid adoption of a CDVC system in the case of a solid cable with kraft paper insulation or even in the case of a solid cable constituted by an insulation including polyolefin resin film.

(4) The viscosity is required to be low enough to an extent so as to have production of the negative pressure limited in a local portion just above the conductor, even if negative pressure is produced in the insulation layer in accordance with the degree of load or the manner of load switching off.

<Index Concerning with the Highness of Insulating Oil Viscosity>

(5) The viscosity is required to be high enough to an extent so as to prevent the solid insulating oil from leaking from a terminal or a damaged portion of the cable easily while the cable is handled (while the cable is manufactured, laid, connected in the site, removed, or in the case where a metal sheath of the cable is damaged accidentally).

(6) The viscosity is required to be not so low that the expansion of insulating oil with viscosity reduced by the high temperature at the time of full load gives influence on the longitudinal direction of the cable successively so that a large amount of the oil moves to the both end portions of a cable line. Then, in the case where this influence cannot be ignored, it is considered to take measures against this separately.

(7) The viscosity is required to be not so low that when a metal sheath of the cable is removed for the jointing work of another cables, the insulating oil inside the cable ins pushed up by the difference of pressure between the outside water pressure in accordance with the water depth and the insulating oil pressure inside the cable so that the insulating oil flows out endlessly to make it difficult to carry out the jointing work. Example of kinds of the joint includes: a site-joint which will be adopted when solid cables laid on the bottom of the sea are joined with each other on the sea so as to be finished into one continuous length; a repair-joint (RJ) which will be adopted when a damaged point of a cable is repaired in a site substantially in the same working conditions, an oil-stop joint, a stop joint (SJ) or a transition-joint (TJ) which will be adopted on the shore portion, and the like.

(8) The viscosity is required to be high enough to an extent so as to prevent the insulating oil from dripping or leaking from a damaged portion to the utmost even at the maximum service temperature.

Experimental Examples

In order to find out insulating oil satisfying the above conditions, the following experiments were performed.

<Relationship Between Migration of Insulating Oil and Sea-water Depth (Sea-water Pressure)>

A solid cable with kraft paper insulation in which the insulation thickness was 20 to 25 mm, and which was in the class of 400 to 500 kV, was put in a vessel, and soaked in water. The water pressure was changed to simulate the depth of sea water. The sea-water pressure is expressed by "(water depth (m) divided by 10) (kg/cm$^2$)".

The structure of the used cable is shown in FIG. 1. FIG. 1 is a cross-sectional view illustrating the structure of an example of a DC submarine solid cable. The cable has, in the order from the center, a conductor 1, an inner semiconductive layer 2, an oil-impregnated insulation layer 3, an outer semiconductive layer 4, a metal sheath 5, an anti-corrosive plastic layer 6, a metal tape 7, a protective yarn layer 8 and wire armoring layers 9.

The oil-impregnated insulation layer 3 is configured in the way that a wound kraft paper tape is impregnated with insulating oil. Here, high-viscosity oil was used as the insulating oil. There may be used, as the insulating tape, a composite tape laminated with kraft paper on one side or both sides of polyolefin resin film, or an insulating tape consisting of polyolefin resin film singly.

According to circumstances, the outer semiconductive layer 4 may include a metal tape or metallized paper in which a metal tape and kraft paper are bonded with each other. As the metal sheath 5, a lead sheath is usually used in the case of submarine cables. As the anti-corrosive plastic layer 6, polyethylene (PE) is mainly used in submarine cables. As the metal tape 7, two metal tapes are usually wound together with a fabric tape. As this metal tape, a zinc-coated steel tape, bronze, brass, or the like, is often used in view of corrosion prevention because this metal tape touches the sea water.

The protective yarn layer 8 is constituted by bedding jute 81 or serving jute 82. Recently, artificial yarn such as polypropylene yarn is often used instead of natural jute. The armoring wire 9 is constituted by winding an iron wire, a zinc-coated iron wire or the like by one layer or two. On occasion, an artificial armoring string such as aramid fiber may be used.

The above-mentioned solid cable was so designed that the temperature of the conductor could be increased to a predetermined temperature by means of a current was applied thereto. Then, the current application was turned ON/OFF to perform a heat cycle test while the water pressure was changed, and the change of internal pressure of the cable (particularly the pressure of the conductor portion) could be read through a pressure gauge connected to a terminal of the cable.

As the result of this test, it was found that, when the water pressure was kept to be 7 to 10 kg/cm$^2$ (the unit can be replaced by atmospheric pressure substantially equivalently) or more, negative pressure was not-produced near the conductor at the time of no load even in conventional high-viscosity oil in the kraft paper insulation layer after one to three cycles of heat cycle (from a room temperature to 50 to 60° C.), and positive pressure could be kept. It was considered that external water pressure propagated to the insulating oil in the insulation layer through the lead sheath.

Figure 2:
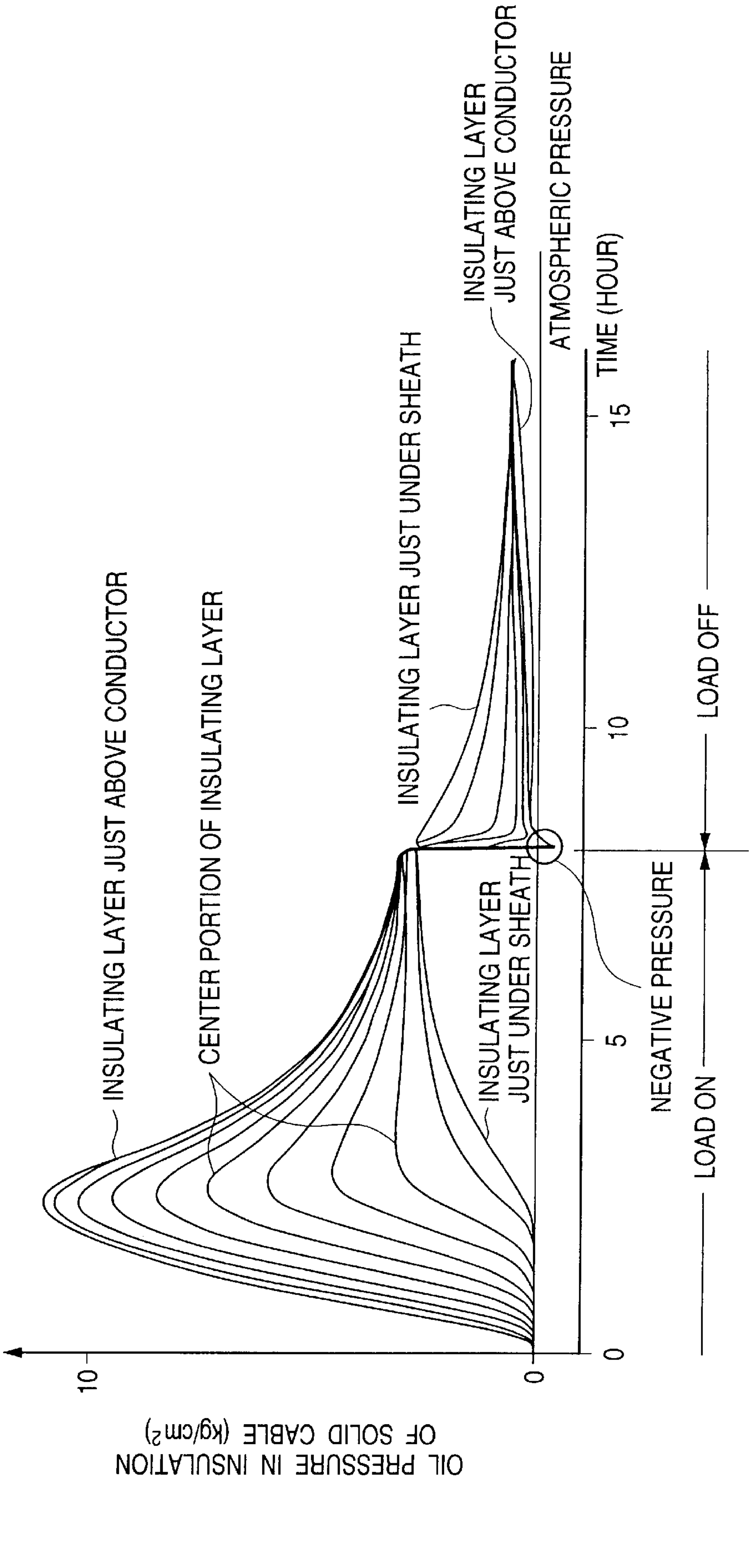
FIG. 2 is a graph showing a change of oil pressure in a solid cable in response to ON-OFF of load in accordance with different positions of an insulation layer.

In order to evaluate the result of the above-mentioned test on the solid cable with kraft paper insulation, conductor loss caused by a current applied to the conductor at the time of load ON/OFF of the cable, diffusion of a heat flow caused by conductor loss in the cable, temperature change in the cable insulation, and an transient change in oil pressure of the insulating oil caused thereby were calculated sequentially by using a computer. An example of the result is shown in FIG. 2.

The oil pressure on the conductor side increases sharply upon load ON. The oil pressure on the metal sheath side follows that on the conductor side with the passage of time. When the temperature change in the inside of the cable insulation disappears so that the temperature becomes stable, movement of the insulating oil in the inside of the cable due to the pressure difference vanishes so that its pressure becomes substantially uniform positive pressure. On the contrary, when load is switched off, the oil pressure drops abruptly with sudden temperature drop just above the conductor so that negative pressure appears slightly in the insulation layer just above the conductor. Then, it is therefore understood that the oil pressure just under the metal sheath is changed with the passage of time so that, at last when the movement of the oil stops, the pressure of the cable as a whole becomes constant and slightly positive.

This calculation result simulates the experimental result extremely well. With this computer simulation, it is possible to evaluate the results when various conditions are changed. It was also found that the maximum oil pressure is generally about 10 kg/cm$^2$ when the maximum conductor service temperature is 50 to 60° C. in a solid cable belonging to a class of 400 to 500 kv and having a conventional structure based on the combination of a kraft paper insulating tape and high-viscosity insulating oil.

Next, by using the same high-viscosity oil, in the same manner, a change of oil pressure was examined on a composite tape (polypropylene laminated paper or abbreviated as "PPLP"), as the insulation layer, which was obtained by laminating kraft paper on both sides of polypropylene (PP) film. Here, the examination was performed while variously changing the thickness ratio k of PP in PPLP, that is, "(thickness of PP film)/(total thickness of PPLP)", into 10, 40, 60 and 80%. Further, the temperature of heat cycle was changed from a room temperature to 50 to 60° C. and 80 to 90° C.

When the high temperature of the heat cycle was 50 to 60° C., the pressure returned slower in PPLP cable than in the kraft paper cable when load was switched off, as inferred. In addition, the larger the ratio k was, the slower the pressure returned. It was therefore found that negative pressure is easy to be produced near the conductor in accordance with the magnitude of load and the conditions of switching off of load. It was however hound that, when the high temperature of the heat cycle is 80 to 90° C., negative pressure is conversely difficult to be produced.

Further, similar examination was performed on an PPLP-insulated solid cable impregnated with sufficiently medium-viscosity oil the viscosity of which is 400 to 500 cst at 60° C. As a result, it was found that the negative pressure characteristics (the easiness to produce negative pressure and the range of the negative pressure) near the conductor when load is switched off are improved conspicuously not only in the case of 50 to 60° C. but also in the case of 80 to 90° C.

This is because the oil flow resistance is proportional to the viscosity of oil, so that insulating oil is easier to move as the viscosity of the oil is lower. That is, when the oil is expanded or contracted in accordance with a temperature difference and the oil volume (amount) per cable insulation unit volume changes so that the oil moves, the product of the oil flow and the oil flow resistance in the oil path makes an oil pressure difference. Accordingly, the oil pressure difference is difficult to be made if the viscosity of the oil is reduced.

Next, in the same manner as described above, an oil pressure change was examined on a solid cable impregnated with medium-viscosity insulating oil of 10 cst at 60° C. Negative pressure was rarely observed.

These results give suggestions as follows.

(1) Even in a solid cable impregnated with high-viscosity solid insulating oil, if the cable is laid to the water-depth of a certain degree (for example, 70 to 100 m) or more, the cable is pressurized by external water pressure so that the internal pressure of the oil of the cable becomes positive even at the time of load off. There is a possibility to produce negative oil pressure, at the time of load off, in both end portions of a submarine cable, that is, in shallower portions, unless insulating oil the viscosity of which is low to some extent is used, or unless other measure is newly taken.

(2) In a solid cable impregnated with solid insulating oil the viscosity of which is not higher than a certain degree (for example, 400 to 500 cst or less at 60° C.), negative pressure is not produced when load is switched off. Alternatively, it may be produced only in such a quitely limited condition, for example, in the case where the cable is laid in a sea shallower than 100 m, and load is switched off suddenly when a large current with conductor current density not lower than 1.5 A/mm$^2$ is being supplied at the time of full load. Therefore, the production of negative pressure can be avoided if some device is given to the structure of the solid cable. In addition, it is considered that even if the conditions of practical use of the cable is somewhat limited to cope with this problem, there may be little harm.

(3) In order to avoid production of negative pressure near the conductor when load is switched off sharply at the time of full load, it is preferable to make the oil pressure, which is uniform in the cable at the time of full load, as high as possible.

(4) The state in the above item (3) is preferable also when the applied voltage is to be made high to increase the transmission capacity of the cable.

(5) In the case of realizing a new cable in which the maximum service temperature of the solid cable is increased from the conventional value of about 50–55° C. to around 80° C., the oil flow resistance becomes lower near 80° C., since the viscosity of the insulating oil is reduced logarithmically as the temperature increases, so that negative pressure becomes difficult to be produced when full load is switched off suddenly.

(6) In the case of realizing a new cable in which the maximum service temperature of the solid cable is increased from the conventional value of about 50–55° C. to 80° C., the temperature change becomes larger than in the conventional case from a room temperature at the time of load off to the maximum temperature of about 80° C. Accordingly, also the increase of the oil pressure inside the cable at the time of full load becomes larger. It is therefore necessary to take measures against this problem. This is important also in the case where the above-mentioned item (3) is taken into consideration.

The insulating oil may be an oil including a solid type rubber. The solid type rubber has large molecular weight. Accordingly, it is possible to enhance the adhesivity between the insulating papers and to prevent the separation of the insulating paper which causes voids.

The viscosity of the insulating oil is from 10 cst to less than 500 cst at 60° C. The insulating oil includes the solid type rubber having the average molecular weight is from 50,000 atomic mass units (amu) to less than 2,000,000 amu.If the viscosity is less than 10 cst at 60° C., the movement of the insulating oil is made easy and voids are apt to be generated. If the viscosity is 500 cst or more at 60° C., the insulation tape layer, especially containing resin film layer at least as part of the insulation, does not allow to pass the oil easily during manufacturing the cable, and it becomes resistant. Therefore, it takes a long time to impregnate the insulating oil to thereby deteriorate the productivity.

If the average molecular weight of the solid type rubber is less than 50,000 amu, the adhesivity is not sufficient. If it is 2,000,000 amu or more, the viscosity is too high to mix oil.

As the solid type rubber, there are isoprene rubber, butadiene rubber, isobutylene-isoprene rubber, ethylene-propylene rubber, polyisobutylene rubber and the like. One or the mixture of these rubbers can be used.

In order to adjust the viscosity of the insulating oil, it is mixed with the solid type rubber and one having low viscosity such as mineral oil, dodecylbenzene (DDB), heavy alkylete, liquid polybutene and the like. Of them, polybutene is preferable because it is hard to swell the polyolefin resin film, especially the polypropylene.

The ratio of the solid type rubber is from 0.1 wt % to less than 8 wt %. If it is less than 0.1 wt %, the adhesivity is not sufficient. If it is 8 wt % or more, the viscosity of the insulating oil is too high to take a long time to impregnate the insulation layer of the cable core during manufacturing the cable, thereby causing productivity problem.

<Process of Impregnation of Insulating Oil and Viscosity of the Insulating Oil>

Based on the above discussion, the impregnation process of insulating oil, which is the most important in manufacturing a solid cable and difficult to control, and the viscosity of the insulating oil were investigated. First, the impregnation process of insulating oil will be described schematically.

In a conventional solid cable, a cable core is taken up in a drying tank, and evacuation and heating is applied to thereby remove air and moisture from an insulation. When the drying the cable core is finished, high-viscosity solid insulating oil usually heated to a hundred and tens degrees centigrade to thereby reduce its viscosity is introduced into the tank, so that the insulation is impregnated with the oil under predetermined pressure in a predetermined time. After that, the cable core is cooled down to a room temperature. Because the insulating oil is contracted by the temperature drop of the cable core from the maximum impregnation temperature to the room temperature, cooling is performed with a predetermined temperature dropping rate under the above-mentioned predetermined pressure.

Here, the heating temperature of the insulating oil is selected within a range in which the performance of the insulation layer is not deteriorated. In the case where the insulation layer consists of only kraft paper, the temperature within the range of from 110 to 140° C. is usually selected. On the other hand, in the case where the insulation layer includes polyolefin resin film, the maximum allowable temperature is determined taking the in-oil melting points of the polyolefin resin film into consideration. The in-oil melting point of polyethylene is about 110° C., and that of polypropylene is about 130 to 140° C.

The maximum applied pressure given at the time of impregnation with the insulating oil is selected to be about 1 to 3 kg/cm$^2$·G in terms of gauge pressure (the pressure in which the atmospheric pressure is expressed to be 0 kg/cm$^2$). Further, though depending on the amount of the cable core, the period of time required for cooling is about one to three months from the maximum impregnation temperature to the room temperature.

If the temperature of the insulating oil is made higher within the range satisfying the above conditions, the viscosity is reduced to make the impregnation itself easy. However, it takes a very long time to cool down an enormous amount of cable core to the room temperature only by cooling measures taken only outside of the tank, so that the industrial productivity is inferior. It is therefore very preferable to apply a temperature as low as possible to the cable core under the conditions in which sufficient impregnation can be carried out.

(Impregnation to a Kraft Paper Insulation Layer)

Figure 3:
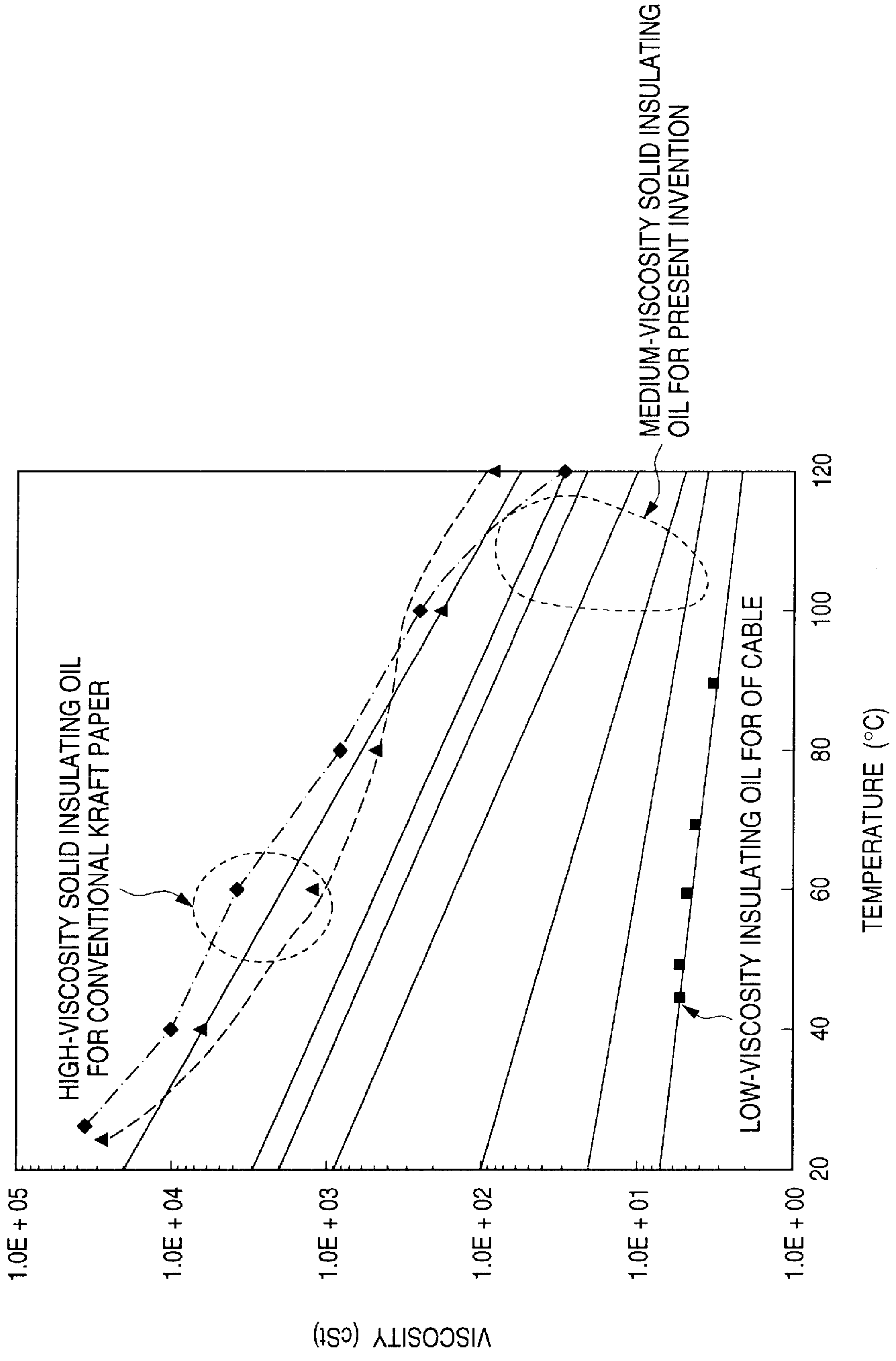
FIG. 3 is a graph showing typical relationship between the temperature and viscosity in typical insulating oils and medium-viscosity solid insulating oils used in the present invention.

Typical relationships between the temperature and viscosity in typical insulating oil and medium-viscosity solid insulating oil used in the present invention are shown in FIG. 3.

In the case of a conventional solid cable constituted by an insulation of only kraft insulating paper tapes, when high-viscosity oil is introduced at the maximum temperature of 110 to 120° C., the insulation can be sufficiently impregnated with insulating oil independently of the insulation thickness. For example, it is confirmed that even 20 to 25 mm thick insulation layer, regarded as necessary for a solid cable of a 500 kV class on design, can be impregnated sufficiently. However, it takes a very long time, for example, one to three months to perform cooling under pressure. Accordingly, this has been a main concern to be improved.

Low-viscosity insulating oil in FIG. 3 is for an OF cable. It is a liquid having enough fluidity at a room temperature to make impregnation possible even at a room temperature, so that the impregnation can be done in a very short time, for example, one to three days. However, because it is a liquid which is not sticky at a room temperature so that it does not satisfy the condition in the above-mentioned <index concerning with highness of insulating oil viscosity>Accordingly, it cannot be used as solid insulating oil.

On the other hand, when the same cable was impregnated with medium-viscosity insulating oil in FIG. 3, that is, oil of 10 to 500 cst at 60° C. in the same impregnation process as described above, the impregnation could be done in a very short time of one month in very case. It was found that the medium-viscosity oil was very preferable in view of the productivity.

(Impregnation to a PPLP Insulation Layer)

Next, a solid cable in which PPLP based on PP representative of polyolefin resin was used as an insulation layer was made on trial, and its impregnation properties were examined. Then, the PP ratio k was selected to be not less than 40% and less than 90%. First, the reason why the PP ratio k was thus selected will be explained.

Figure 4:
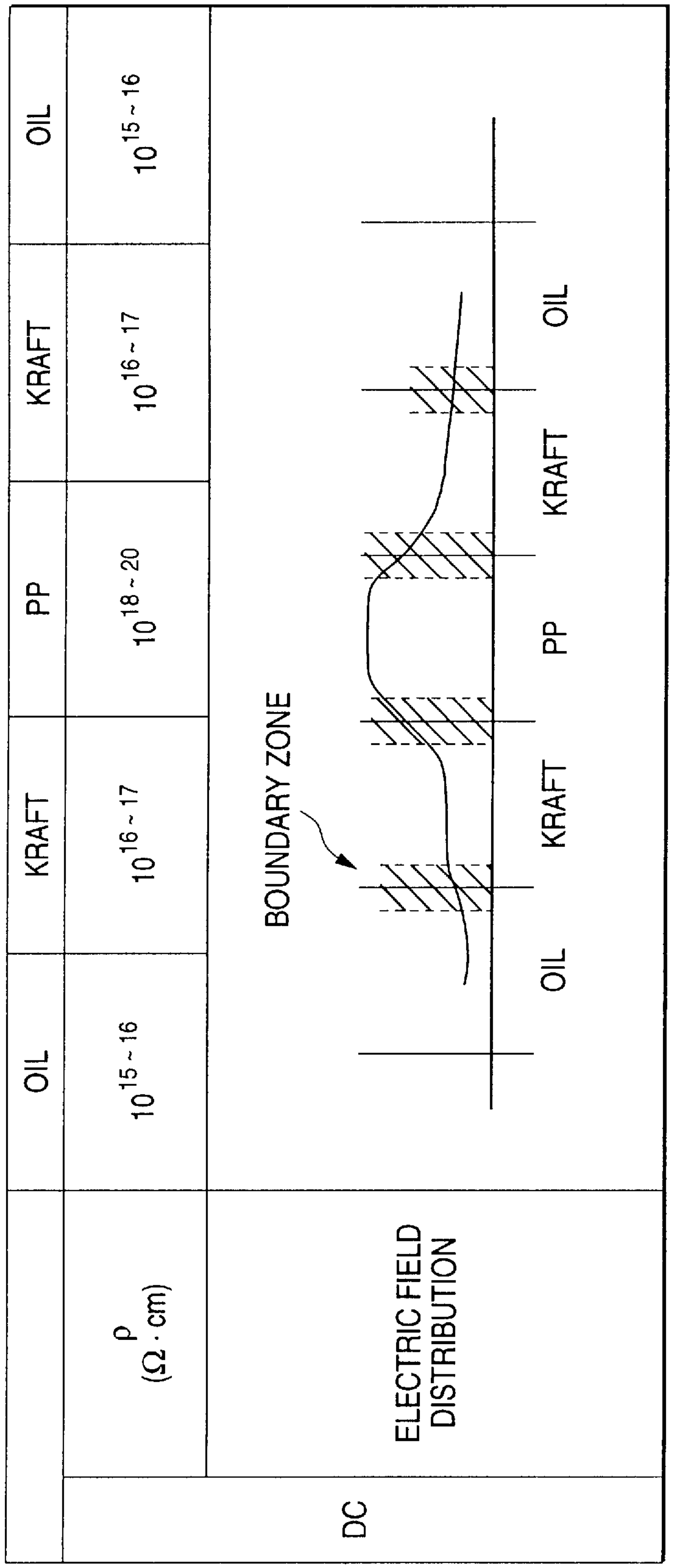
FIG. 4 is an explanatory view showing a structure of PPLP in which both sides of polypropylene (PP) film are laminated with kraft paper, resistivities ρ (Ωcm) of each insulating material environing PPLP, and DC stress distribution proportional to each resistivity.

FIG. 4 shows a structure of PPLP laminated with kraft papers on both sides of PP film, a resistivity ρ (Ωcm) of each insulating material, and DC stress distributions which are proportional to the resistivity. PP film which is dense in itself has an overwhelmingly higher DC withstand voltage characteristic than that in porous kraft paper. However, when an AC insulation tape was developed, it was known that PP film is fragile if an electric streamer hits on its surface directly. In order to improve this fact and ensure an oil path, PPLP laminated with kraft paper on both sides of PP film was developed.

Figure 5:
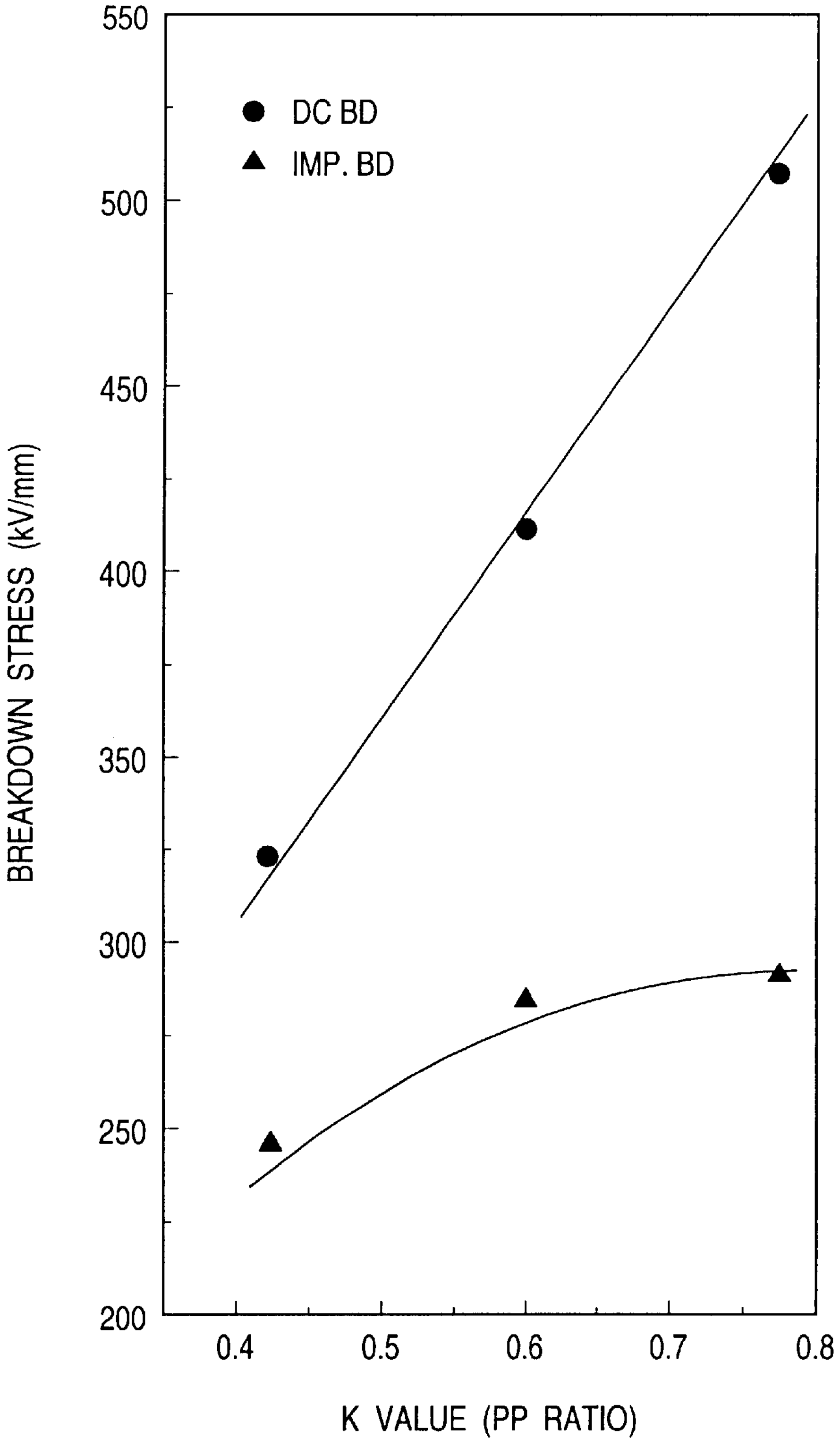
FIG. 5 is a graph showing the relationship between PP ratio k in the PPLP and breakdown stress in terms of Impulse and DC voltages.

Initially, PPLP developed for an AC cable was laminated with kraft paper having comparatively low air impermeability (for example, about 1,500 Gurley seconds) in order to realize low loss {low permittivity (ε) and low loss angle (tan δ)} and to realize high impulse (Imp.) withstand voltage. In addition, it was considered that both AC and Imp. take peaks of breakdown voltages when the PP ratio k stands in the range of 40 to 50%, as shown in FIGS. 4 and 5 in "Study of Polypropylene-Laminated Paper for Extra-High Voltage (EHV) and Ultra-High Voltage (UHV) OF Cables", Papers of The Institute of Electrical Engineering of Japan [52–A53 (1977, vol. 97, No. 8)], Pages 403 to 410. Therefore, PPLP of the PP ratio k of 40 to 60% was used for conventional AC (DC) OF cables, because it was very difficult and expensive to increase the PP ratio k.

As the result of development of the investigation under the confidence that there should be a special PPLP suitable for DC solid cables, the present inventors found out the followings.

(1) DC stress concentrates in PP film superior in DC withstand voltage because of a difference of ρ between kraft paper and the PP film. Accordingly, it is natural that the DC breakdown strength is expected to be raised in proportion to the PP ratio k.

(2) In the case where PPLP is made up by extruding molten PP between two sheets of kraft paper, the fragility of the PP film surface can be overcome by the boundary zone (the hatching portion in FIG. 4 in the paper) of the PP film surface where PP and fibers of kraft paper are tangled with molten PP film at its boundary zone.

(3) Because in the case of CD cables, there is no dielectric loss as is induced in AC cables, no particular electrical loss condition exists in the kraft paper laminated. Accordingly, by the use of kraft paper having slightly high air impermeability, for example, 3,000 Gurley seconds or more, it is possible to overcome the disadvantage that the Imp. breakdown strength begins to decrease when the PP ratio exceeds 40 to 50%.

From such a view point, PPLP having a high PP ratio, which was not only less necessary but also difficult to be manufactured industrially in practice, was developed without changing the total thickness form the conventional value (100 to 150 μm). A detailed example of a method of manufacturing the new PPLP having a high PP ratio is disclosed in Japanese Patent Application No. Toku Kai Hei 10-199338. According to this method, PPLP the PP ratio of which exceeds, for example, 80% can be obtained.

FIG. 5 shows an example of dielectric performances measured on above mentioned new PPLP. DC breakdown strength increases linealy with the increase of PP ratio as is expected. In addition, it is understood that Imp. breakdown strength is also improved, though slightly in comparison with DC, beyond the conventionally recognized PP ratio which gives the highest Imp. breakdown strength to the conventional PPLP.

Figure 6:
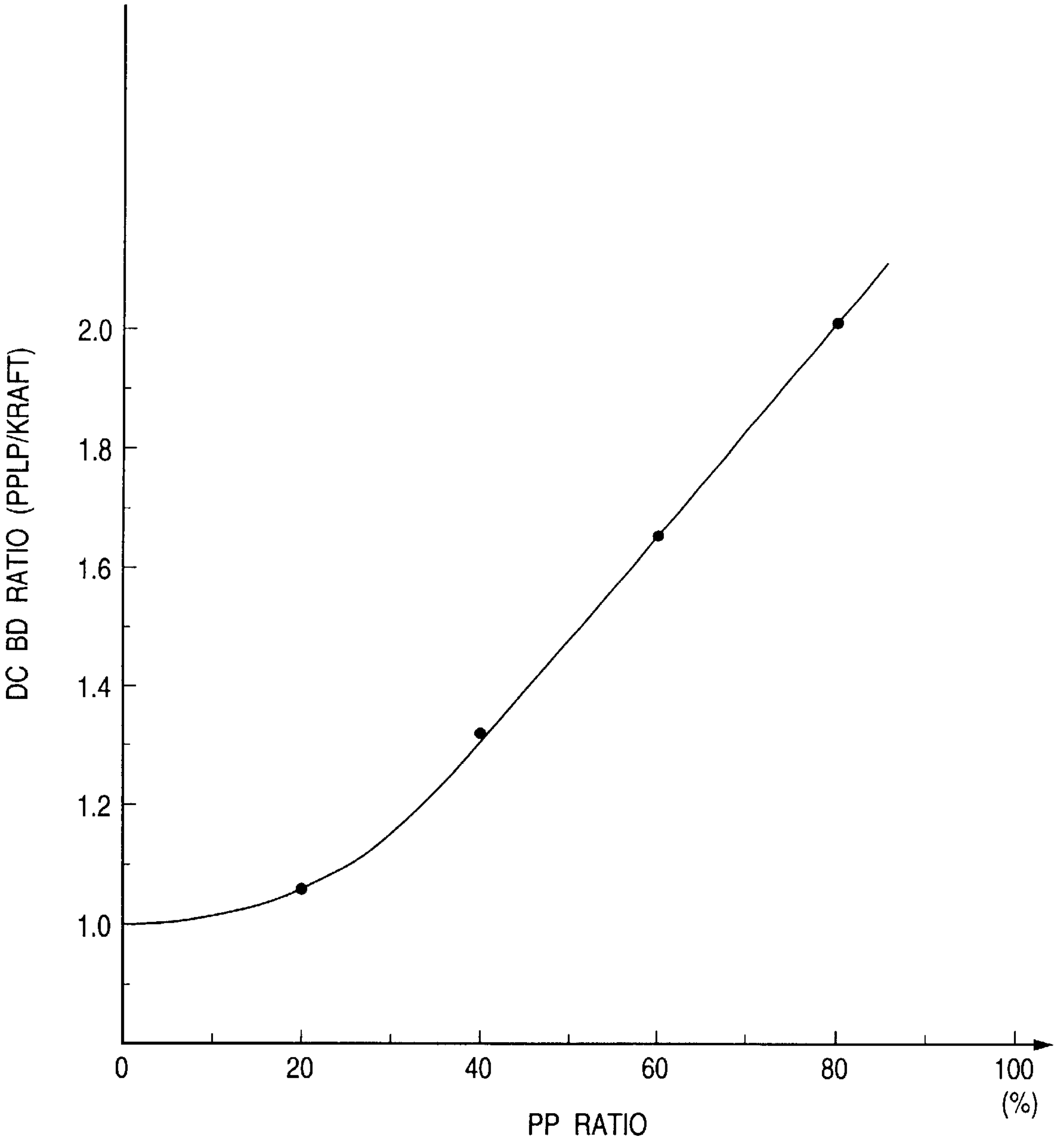
FIG. 6 is a graph showing the relationship between the ratio of DC breakdown voltage values of PPLP to those of DC high impermeable kraft paper for DC cable and the PP ratio of PPLP K.

In addition, FIG. 6 shows how the ratio of DC breakdown voltage of PPLP to that of high impermeable kraft paper for conventional solid cable changes with the increase of PP ratio of PPLP. In the case of using an expensive insulating tape such as PPLP having a high-grade and complicated structure, it is natural that the effect of improvement should be expected so much. From FIG. 6, it was concluded that PP ratio of 40% or more was preferable because the effect to improve the DC breakdown strength value was not remarkable when the PP ratio was less than 40%. On the other hand, description will be made later as to in which point the PPLP having a high PP ratio is suitable for solid cables other than the high DC breakdown strength, and as to how it is advantageous to have many kinds of PPLP with different PP ratios, these are the heart of the present invention.

First, a cable (Trial Example 1) insulated with the PPLP with the PP ratio of k=40%, whose insulation thickness was 15 mm was produced, and impregnated with conventional high-viscosity insulating oil in the same manner as the above-mentioned impregnation process. As a result, impregnation could be done satisfactorily, though the time of impregnation was considerably elongated in comparison with a kraft paper cable.

Next, a cable (Trial Example 2) having the insulation thickness of 23 mm was produced by use of the same PPLP as in Trial Example 1, and impregnated with high-viscosity insulating oil in the same manner as the above-mentioned impregnation process. As a result, it was found that it needs very high pressure and a very long time impregnate up to the innermost layer of the insulation layer. Accordingly, it was found that large improvement is required industrially.

The same cable as that in Trial Example 2 was used and impregnated with medium-viscosity insulating oil of about 500 cst at 60° C. in FIG. 3 (Trial Example 3). At this time, the impregnation could be done more easily than that under the impregnation conditions in the conventional kraft paper.

Next, by use of PPLP having the PP ratio of over 80%, a cable having the insulation thickness of 20 mm inferred as the insulation thickness of a cable corresponding to 500 to 700 kV was produced, and impregnated with the medium-viscosity insulating oil used in Trial Example 3 in the same manner as the above-mentioned impregnation process (Trial Example 4). At this time, the impregnation could be attained up to the innermost layer with difficulty. However, it was found that it was very difficult to manufacture the cable industrially, and it was not preferable to use insulating oil with viscosity higher than this case.

Further, the cable having the same configuration as that in Trial Example 4 was impregnated with medium-viscosity insulating oil of 30 to 400 cst at 60° C. (Trial Example 5). Then, the impregnation was improved conspicuously as the viscosity was lower. As a result, it was found that insulating oil with the viscosity not more than 500 cst at 60° C. was preferably used for PPLP. Also in the case of a kraft paper cable by using medium-viscosity insulating oil, not only the impregnation could be performed conspicuously easily, but also the maximum impregnation temperature could be reduced, as mentioned above. It was found that it was possible to shorten the impregnation time very preferably in industrial production.

The viscosity of oil satisfying the above-mentioned <index concerning with the highness of insulating oil viscosity> was investigated on the basis of the above consideration. The state and results of the investigation will be explained with together.

On the assumption that the location as southward of Japan and the ambient temperature was lower than 40° C., the state in which insulating oil impregnated in a cable dripped down from a cross-section of the cable was observed. In the case of a conventional solid cable insulated with kraft paper singly, the insulating oil oozed out at most without blowing out continuously so that sealing could be attained satisfactorily with a vinyl tape or the like so long as the viscosity of the insulating oil was not less than 50 cst at 40° C. Further, even if the viscosity was lowered to bout 15 cst, the sealing could barely be attained, but it was very difficult to handle the sealing. However, on the assumption that the location was northward of Japan and the ambient temperature was 5 to 20° C., the oozing-out of the insulating oil was reduced conspicuously in proportion to the increase of the viscosity even with the same insulating oil.

In the case of an insulating tape (for example, PPLP) including a polyolefin resin film layer, on the other hand, the amount of oozing-out of the insulating oil became extremely small even under 15 cst at 40° C. in comparison with the case of insulation having kraft paper singly, because the amount of insulating oil in the insulation layer was reduced and the PP film layer with no pores showed a very large oil flow resistance.

Figure 7:
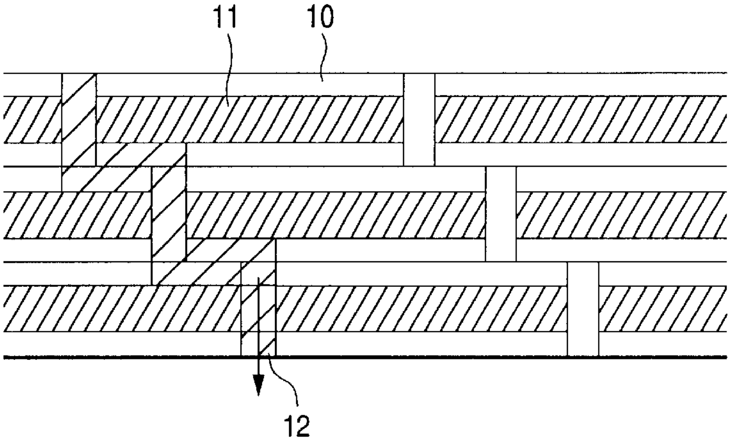
FIG. 7 is an enlarged sectional view of an insulation layer based on PPLP.

This fact will be explained with reference to FIG. 7. In FIG. 7, pores occupy 30 to 50% of the portion of kraft paper 10. The pores contain the insulating oil therein and allow it to pass therethrough. On the contrary, a PP film layer 11 absorbs the insulating oil but it does not make the absorbed insulating oil flow outside the film, and does not allow the insulating oil to pass through the film at all. The insulating oil moves through an oil path 12 including the pores in kraft paper fibers and the abutt spaces (oil gaps) between PPLP of the same layer. Therefore, the quantity of oozing-out of the insulating oil was not larger than about a half at the PP ratio of 40%, and not larger than 10% at the PP ratio of 80% compared with that at the kraft paper singly. Accordingly, even in the case of insulating oil of 15 cst at 40° C., it is extremely suitable for a solid cable if the PP ratio is not less than 40%.

As described above, it was found that the viscosity of not less than 15 cst at 40° C., that is, not less than about 10 cst at 60° C. was preferable for the insulating oil (see FIG. 3).

Arranging these results, insulating oil the viscosity of which is 10 to 500 cst at 60° C. is preferable as solid insulating oil. The viscosity of insulating oil at 60° C. (the temperature in which an allowance is given to the maximum conductor temperature of a kraft solid cable) had better be uniformly used to compare various kind of insulating oil easily. Insulating oil with the most suitable viscosity may be selected taking account of the material constituting the insulation layer, the PP ratio k, the constituent ratio of PP and kraft paper in the whole insulation layer, the transmission capacity of the solid cable, the transmission operation conditions including a load switching-off method, and the environment for the solid cable to be used.

<Increasing Internal Oil Pressure by the Application of Reinforcing Tape Layer>

Next, means for preventing, to the utmost, negative pressure from being produced near a conductor when load is switched off will be described below. This means is the most important point for a solid cable.

From the above-mentioned investigation, it was found that negative pressure was hardly produced in a conventional solid cable with kraft paper insulation in any case of load switching-off in the change of internal pressure in FIG. 2 so long as medium-viscosity insulating oil was used.

An insulation layer including polyolefin resin film was examined by using the above-mentioned PPLP. In this case, because of high dielectric strength of PPLP, there are two attempts: (1) an attempt in which the maximum service temperature is set to about 50° C. which is as high as that in a conventional kraft paper solid cable, while the service voltage is increased from a conventional value of 450 kV or less up to 500 to 600 kv or a 700 kV level to thereby increase the capacity; and (2) an attempt in which the maximum service temperature is increased up to about 80° C. to thereby increase the capacity. Alternatively, there is another attempt in which both the above-mentioned attempts are combined to thereby make the performance of the cable higher having its capacity larger. In either case, it is necessary to increase the ratio of polyolefin resin film in order to make the performance higher. Since the oil flow resistance described in FIG. 7 increases then, it is preferable to take measures to cope with negative pressure as much as possible.

Here, investigation is made here as to prevention of negative pressure by making the oil pressure inside a solid cable higher. As is understood from FIG. 2 and as is described above, when a certain time has passed after application of a load current, the temperature gradient in the cable is saturated to become constant, and in response to this, the insulating oil stops expanding so that the oil pressure inside the cable becomes constant positively. After that, when the load broken off, the temperature near the conductor decreases sharply, so that the volume of the oil thereabout contracts, which causes the oil pressure there to drop transiently. If the oil does not move quickly in the radial direction from the outside toward the inside by the differential pressure generated at a load switching off, negative pressure is produce, as already described above. The easiness of movement of the oil at that time is inversely proportional to the magnitude of the oil flow resistance of the insulation layer, and proportional to the oil pressure difference between the outside and the inside of the insulation layer.

Since an oil path is limited narrowly to the portion of kraft paper so long as PPLP is used, the oil flow resistance is increased. However, because the oil flow resistance is decreased in accordance with the decrease of viscosity, the above mentioned increase of the oil flow resistance is canceled out if medium-viscosity insulating oil is used for PPLP insulation. In addition, it is regard as preferable to use the cable at the full load temperature as high as possible because the viscosity is more decreased. Furthermore, in order to enlarge a difference in oil pressure at the time of load off between the outside and the inside of the insulation layer, it is needed to heighten the oil pressure which is constant in the whole insulation at the time of full load, that is, to heighten the oil pressure immediately before switching off of the load as show in FIG. 2.

When the cable is used at a high temperature, the oil expands in proportion to a temperature difference between an ambient temperature and the high temperature. Accordingly, if the volume of the insulation layer does not increase much enough to absorb the expansion of the oil, the oil pressure will conspicuously increase. This is, however, preferable for the purpose of increasing the oil pressure immediately before load switching off, and therefore, should be utilized positively. However, a metal sheath (usually, made of lead) of the cable is required to be able to withstand this high oil pressure. If cannot withstand, the metal sheath will expand so as not to allow the pressure to increase, or when the state becomes worse, the metal sheath may be ruptured, or be fatally wounded by metal fatigue due to repeated load cycles. This is another reason why the maximum service temperature has been limited.

On the other hand, in the structure of the conventional solid cable shown in FIG. 1, the polyethylene (PE) anti-corrosive layer 6 rich in elasticity was provided just onto the metal sheath 5 (lead sheath). This was because an extruder for lead and an extruder for PE were connected in tandem to thereby make production easy and inexpensive. In addition, in view of negative pressure, the service temperature was limited to a low temperature in the conventional solid cable. Accordingly, the oil pressure did not increase and any problem did not occur.

Further, the metal tape 7 for internal pressure protection was provided just onto the anti-corrosive layer 6. Since the sea water reached the portion of the metal tape 7, the material of the metal tape 7 was limited to zinc-coated steel, bronze or brass from the view point of corrosion. High tensile strength cannot be expected in any tape of these materials. In addition, the influence of sea-water upon the corrosion of the metal tape 7 cannot be avoided so that high internal pressure protection cannot be expected also from this point of view.

Therefore, the present inventors though out that a reinforcing layer (not shown) for protecting the internal pressure of the metal sheath 5 is provided inside the high-elasticity anti-corrosive layer 6, that is, just onto the metal sheath 5.

As the materials of the reinforcing layer, it is possible to use stainless steel (SUS) tape, aramid fiber, etc. which can obtain high tensile strength easily and which are available industrially easily. SUS 304 is preferable because it is advantageous in view of price. The reinforcing layer may be constituted by winding a fabric tape together with the SUS tape when necessary.

SUS 304 is apt to be corroded if it touches the sea water, and aramid fiber or the like may have a trouble of deterioration caused by the sea water. However, in this invention, the reinforcing layer is applied inside the anti-corrosive plastic layer 6. Hence, protected from the sea water, SUS can easily provide tensile strength of about 40 $kg/mm^2$ or more, and high tension SUS tape not less than 100 $kg/mm^2$ is also available. A high internal-pressure resistance type cable can be realized easily if this SUS is made into a tape having required thickness and the tape is wound by required number of turns.

Measured maximum oil pressure and computer-calculated oil pressure in the kraft paper solid cable of FIG. 1 was transiently about 10 $kg/cm^2$ just above the conductor, but constant oil pressure after being stabilized was about 2 to 4 $kg/cm^2$ at most.

On the other hand, when the reinforcing layer was provided just onto the metal sheath, the constant oil pressure after being saturated could be made 10 $kg/cm^2$ or more easily. In addition, if a cushion layer such as a fabric tape is desirably provided under the SUS tape, that is, between the lead sheath and the SUS tape, this ultimate constant oil pressure can be controlled easily, advantageously. This ultimate constant pressure changes complicatedly in accordance with the degree of impregnation of the insulating oil in a factory, the space between the cable core and the metal sheath in a metal sheath extrusion process, the degree of deformation of the metal sheath, the temperature of the insulating oil heated in the metal sheath extrusion process or anticorrosion plastic layer extrusion process, the ambient temperature of the route where the cable is laid, the depth of the bottom of the sea where the cable is laid, and the like.

It was found that negative pressure was not produced after load was switched off in most case of kraft paper solid cables when obtaining saturated constant pressure of about 10 $kg/cm^2$ or more.

Next, a new solid cable using a PPLP tape in which the maximum service temperature could be increased to about 80° C. was investigated. In this case, the temperature difference between the ambient temperature (no-load temperature) and the maximum conductor temperature is so large that the oil pressure reaches 100 kg/cm$^2$ or more on calculation if the expansion and contraction of the lead sheath are not counted in. Also in this case, reinforcement can be achieved by using SUS tape having the tensile strength of 100 kg/mm$^2$, and winding plural sheets of tapes to be about 1 mm thick in total with the safety factor of 2.

Practically, the pressure rarely increases to such a high value because of various uncertainty conditions affecting the ultimate constant pressure, the difficulty to keep 100% impregnation of a completed solid cable with insulating oil, the existence of expansion and contraction in the reinforcing layer and the metal sheath, and the like.

Further, it was found that, the increase of the internal oil pressure is reduced in the case of PPLP, because the volume of insulating oil as expanding material is much smaller than that of kraft paper, and PPLP itself reduces its thickness by oil pressure to thereby compensate the increase of pressure of the oil. To expect this effect so much, it is preferable to increase the PP ratio in PPLP. Therefore, PPLP in which the PP ratio k is a little over 80% is suitable for a solid cable to be operated at high temperature.

In order to promote this effect of PPLP, it will go well if the ratio of a resin film layer existing in the whole insulation of the cable is increased while alternating a kraft paper and a resin film so as to maintain oil path composed of porous kraft paper.

Figure 8A:
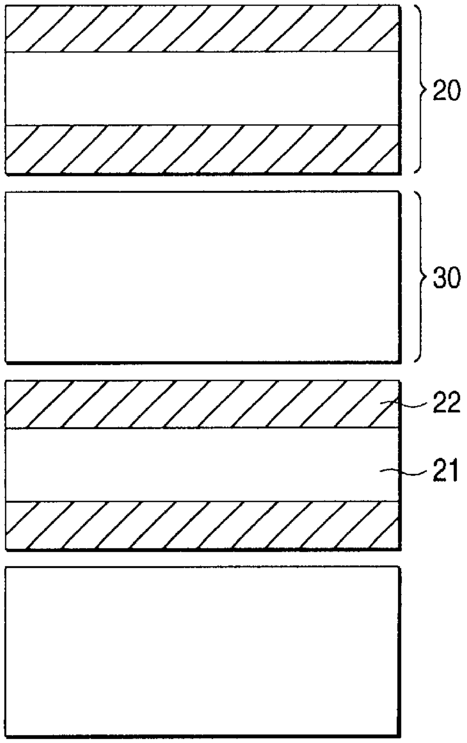
FIG. 8A is a partially sectional view of an insulation layer in which PPLP is stacked.

FIG. 8A shows an insulation layer using only a composite tape 20 in which PP film 21 is laminated with kraft papers 22. In this case, when the PP film ratio k is 40% in one sheet of the composite tape 20, then it is also 40% for the total insulation of the cable.

Figure 8B:
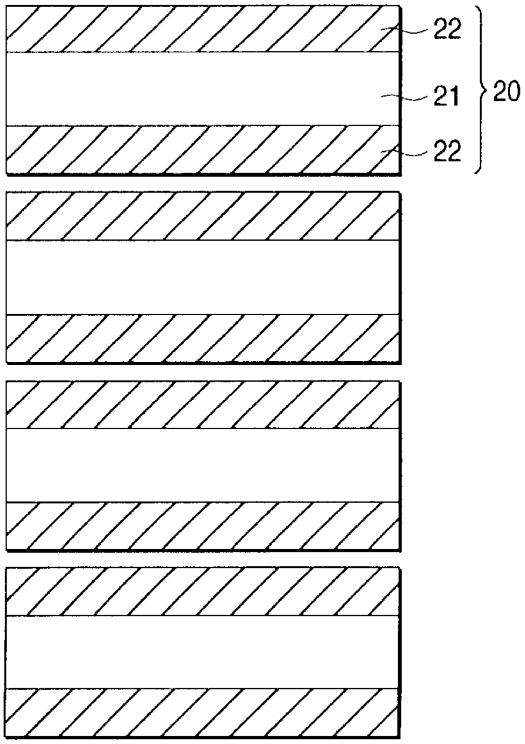
FIG. 8B is a partially sectional view of an insulation layer in which PPLP and polypropylene film are stacked alternately.

However, as shown in FIG. 8B, when the insulation is formed by alternating the composite tape 20 with tape 30 consisting of PP film singly, layers of the kraft paper 22 are always interposed between each PP film layer. Accordingly, an oil path and a cushion layer are ensured. For example, when the respective tapes have the same thickness and the PP film ratio k of the composite tape 20 is 40%, the PP film ratio of the total insulation can be increased to 70% by winding these types alternately. Consequently, the amount of insulating oil per unit insulation volume can be reduced to increase the contractility of the film by the internal oil pressure, and to reduce the oil flow resistance. This fact is extremely preferable for a medium-viscosity insulating oil immersed solid cable.

In addition, this fact is preferable on the electric performance because the ratio of the kraft paper layer resistivity of which is too low to share DC stress is reduced, and on the contrary, the ratio of the resin film layer which is strong against DC stress is increased.

<Configuration of Transmission Line>

Figure 9:
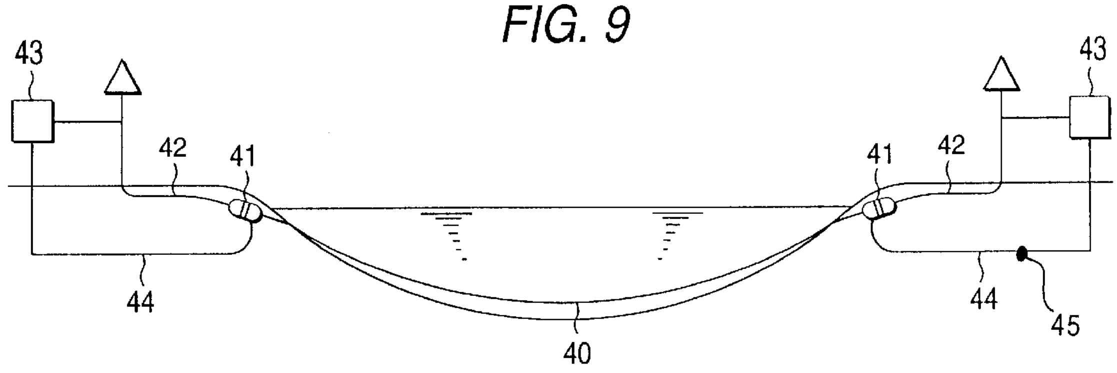
FIG. 9 is a schematic configuration view of a transmission line according to the present invention.

This increase of the internal oil pressure caused by the temperature difference and the expansion of the insulating oil is a phenomenon appearing over the whole length of the cable. Not to say, the phenomenon occurs near both ends of the cable. Therefore, when the viscosity of the medium-viscosity insulating oil is reduced while operating the cable at high temperature, there is a fear that this expanding insulating oil injures each terminal. Therefore, as shown in FIG. 9, it is preferable that oil stop joint boxes 41 (Stop-Joint or abbreviated as SJ)are provided near both ends of a solid cable at a submarine-portion 40, preferably at the shore separating the land cable 42 from the submarine cable which is different from the former in ambient temperature, and both cables are connected by SJs 41. As a result, high-temperature insulating oil is prevented from moving due to expansion of the oil. Any sort of these land-portion cables 42 may be employed. When the land-portion cable 42 is different from the submarine-portion solid cable, a transition joint (TJ) is used.

As described above, there is a case that, in a solid submarine cable put in the sea not deeper than the depth of about 70 to 100 m, that is, in a cable near the shore portion, negative pressure may be produced at the time of no load because of lack of external water pressure, particularly, this tendency is conspicuously observed when a cable is laid in the state where insulating oil inside a cable metal sheath is insufficient. This is not preferable in view of the electric performance when load is switched off.

Therefore, it is preferable that oil feeding tanks 43 are provided at the both terminals of a transmission line in order to keep insulating oil in the inside of the terminals and to supply insulating oil to the cable in which insulating oil is insufficient by slightly positively pressurized insulating oil in the tank 43 the viscosity of which is medium or lower.

When the submarine-portion solid cable 40 is a conventional kraft paper cable and connected directly with the terminals at both ends without intercalating SJ (not shown), oil feeding tanks are provided and connected with each terminal to supply insulating oil to the solid cable the viscosity of which is medium or lower.

When the submarine-portion solid cable 40 is a solid cable having an insulation layer, at least, a certain portion of which contains polyolefin resin film and used at a high temperature, oil feeding pipes 44 are connected to the submarine cable side of SJ 41 and coupled with the oil feeding tanks 43 to supply oil, as shown in FIG. 9. Not to say, the oil feeding tanks 43 are connected also to the land-portion cables 42 to supply the insulating oil to the land-portion cables 42. In this case, it is preferable to provide a check valve 45 between the SJ 41 and the oil feeding tank 43 so that the oil is prevented from flowing backward from the submarine-portion solid cable 40 to the oil feeding tank 43 because of the high temperature and high oil pressure of the submarine-portion cable at the time of load on.

The load-portion cable 42 which is on the land side of the SJ 41 may be an OF cable or a solid cable. It will go well if insulating oil in the oil feeding tank is changed suitably in accordance with the sort of the cable. That is, low-viscosity insulating oil may be used for an OF cable, and medium or lower viscosity insulating oil may be used for a solid cable.

<Relationship Between SP Value of Insulating Oil and SP Value of Polyolefin Resin Film>

Here, in order for a solid cable to show the electric performance fully, it is important to select the combination of SP values (solubility parameter) of resin polyolefin resin film and insulating oil when an insulating tape employing polyolefin resin film at least partially is used in a solid cable.

Figure 10:
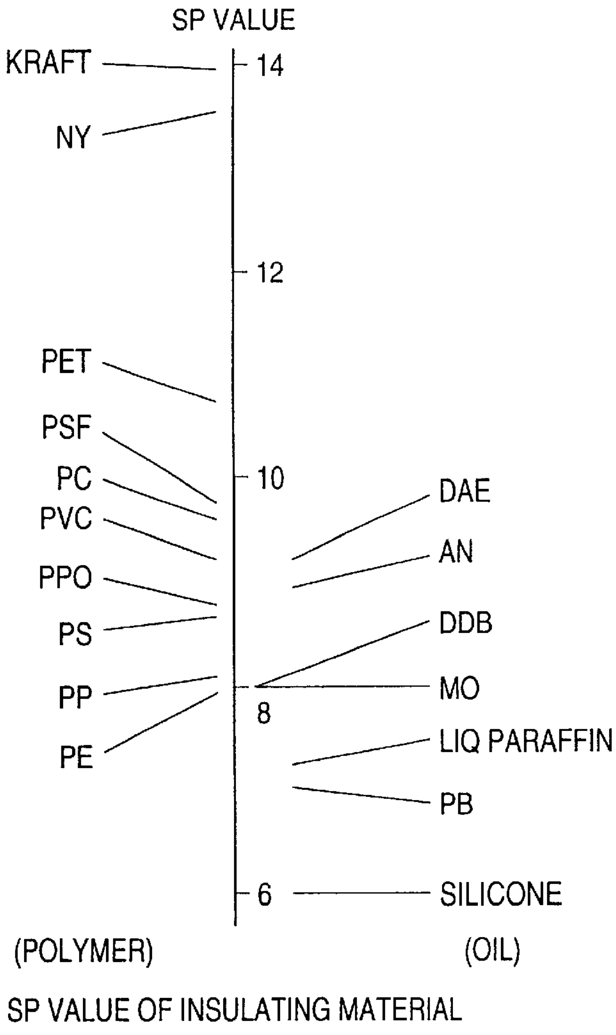
FIG. 10 is an explanatory view in which SP values of resin polymers and oils are compared with each other.
Figure 11:
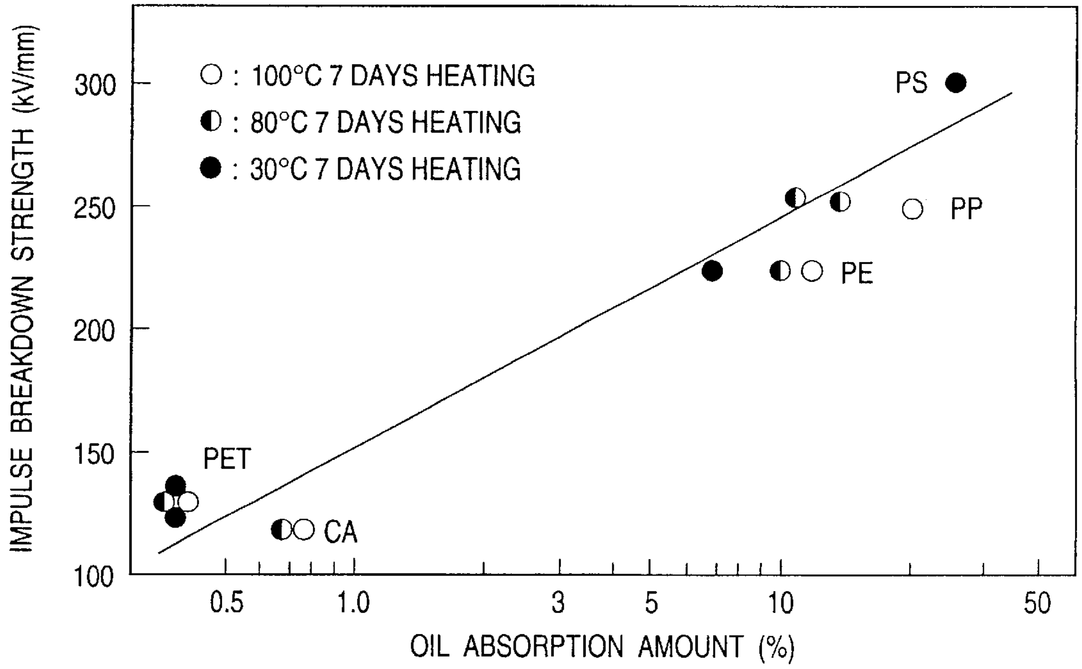
FIG. 11 is a graph showing the relationship between the absorption (increase rate of weight) of mineral insulating oil (the SP value of which is a little less than 8) and the Imp. breakdown strength in respective resin films.
Figure 12:
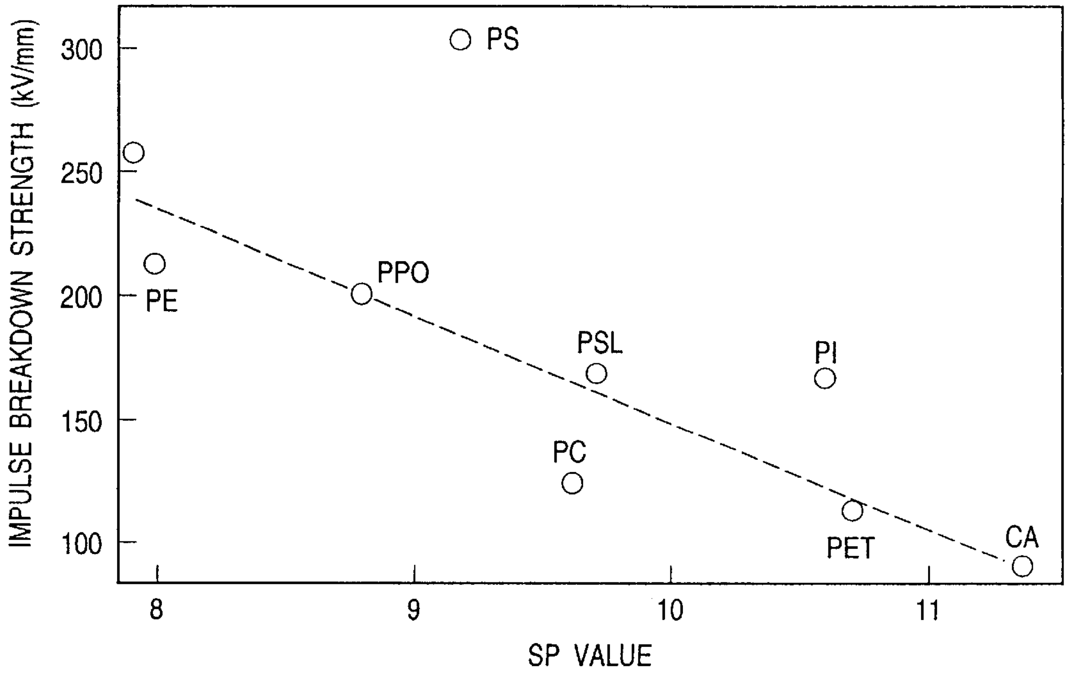
FIG. 12 is a graph showing the relationship between the Imp. breakdown strength of resin films impregnated with mineral-oil insulating oil the SP value of which is a little less than 8 and the SP values of the resin films.

FIG. 10 shows SP values of resin polymers and oils in comparison. In addition, FIG. 11 shows the relationship between the absorption amount of mineral insulating oil family (the SP value is a little less than 8) and the Imp. breakdown strength in respective resin films. In addition, FIG. 12 shows the Imp. breakdown strength of resin films impregnated with mineral insulating oil the SP value of which is a little less than 8, through the relationship with the SP values of the resin films.

It is understood from these drawings that as the SP value of resin film is closer to the SP value of insulating oil, the resin film absorbs the insulating oil to improve the electric performance. The improvement of the electric performance is observed all over AC, impulse and DC. Particularly, in the case of polyolefin resin film, it was found out that this effect was conspicuous if synthetic oil the SP value of which was around 8, that is, alkylbenzene-family insulating oil (for example, dodecylbenzene insulating oil: DDB) was used, so that the both DC and impulse breakdown strength could be improved by about 10% in terms of both DC and Impulse.

As for medium-viscosity insulating oil bringing out such an effect, it is preferable to produce it by adjusting the viscosity by using blended insulating oil of one or more kinds of polyester-family insulating oil, polybutene-family insulating oil, mineral insulating oil, alkylbenzene-family insulating oil or heavy alkylate-family oil which is a kind thereof, etc.

In order to make this effect more conspicuous, it is preferable to ensure the oil absorption of resin film sufficiently in advance. To this end, it is advantageous to use a method in which low-viscosity oil near in SP value with resin film is absorbed sufficiently into a film layer, and then medium-viscosity insulating oil most suitable for a solid cable is impregnated with a cable.

Low-viscosity insulating oils for OF cables have viscosity of 10 cst or less at a normal temperature and is impregnated very easily. DDB a kind of alkylbenzene-family insulating oil has an SP value of 8, and it is extremely well absorbed in polyolefin resin film. Therefore, a cable core is impregnated with DDB in advance after being dried. After that, the cable core is kept at 80° C. or more for 24 hours or more to thereby make the film absorb the oil. Then, DDB is deoiled from the cable core and the cable core is impregnated with medium-viscosity insulating oil. In such a manner, the above-mentioned effect can be obtained stably without lowering the productivity.

<Grading of Insulation Layer>

Further, the present inventors obtained insulating tapes different in the composite ratio of kraft paper and polyolefin resin film, and attained improvement of the electric performance of the cable combining these insulating tapes skillfully to make the distribution of electrical stresses desirable in a solid DC cable. The insulating tapes herein include a tape of kraft paper singly, a composite tape of kraft paper and polyolefin resin film, and a tape of polyolefin resin film singly.

Figure 13:
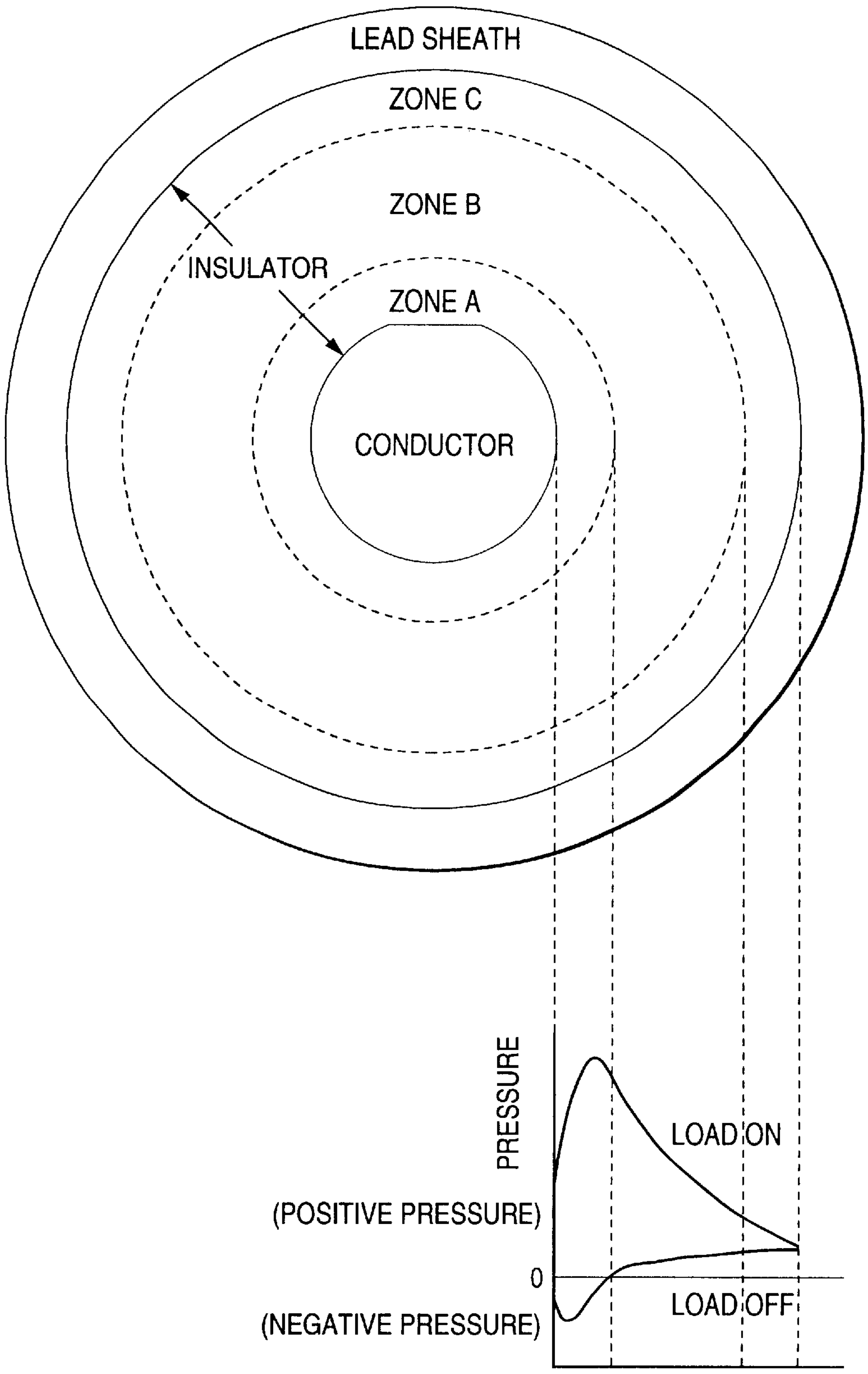
FIG. 13 is an explanatory sectional view of a cable in which ρ- and ϵ-gradings are given to an insulation layer.
Figure 14:
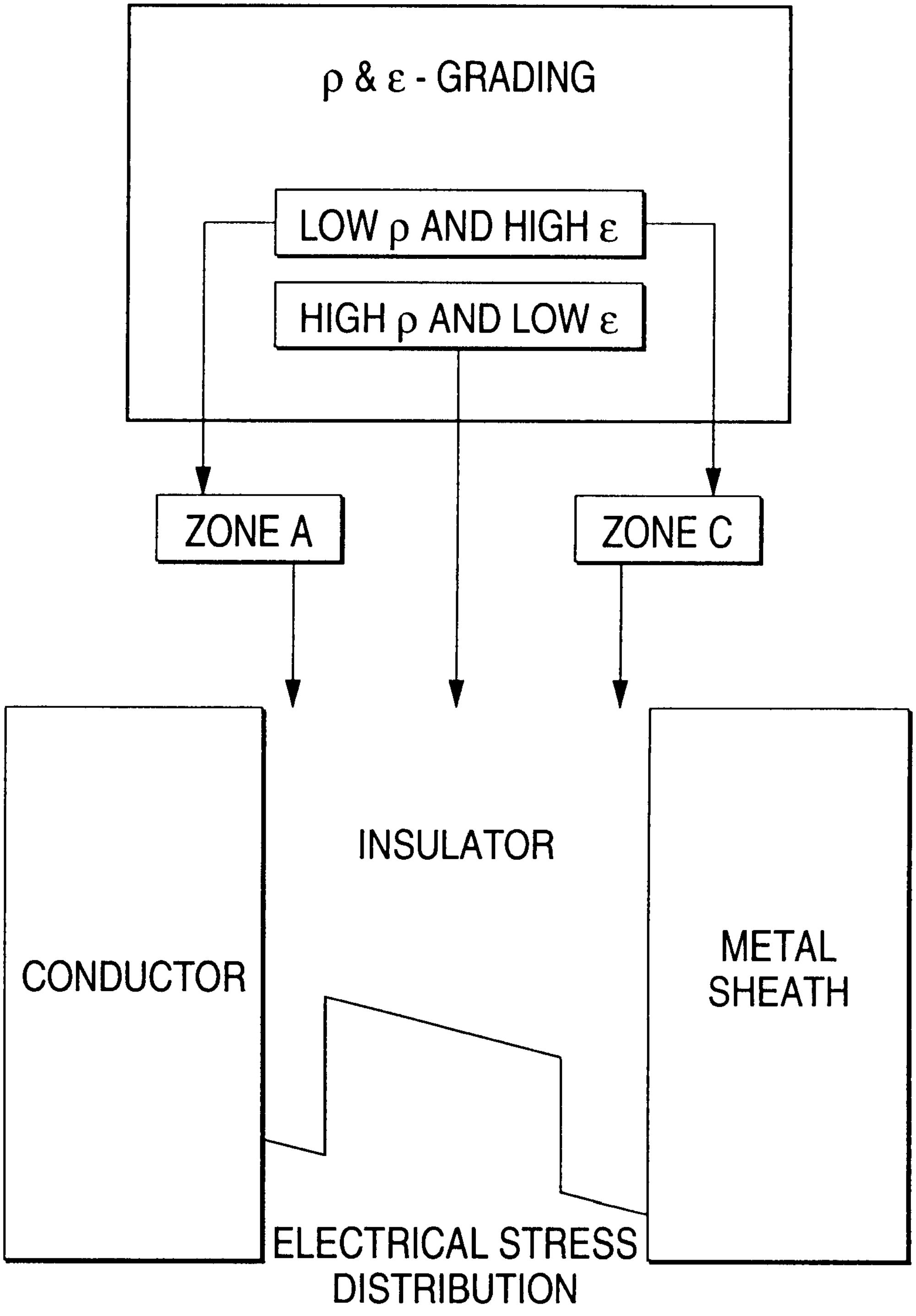
FIG. 14 is an explanatory view showing the DC and Imp. stress distributions in an insulation layer between a conductor and a metal sheath.

For example, by using kraft paper (permittivity $\epsilon$=3.4, and resistivity $\rho=\mathbf{10}^{14}-10^{17}$ Ω·cm) and PPLP (k=40% equivalent, permittivity $\epsilon$=2.8, and resistivity $\rho=10^{16}-10^{18}$ Ω·cm), a kraft paper tape layer is disposed in a zone A on the conductor and in a zone C just under the metal sheath, and PPLP is disposed in a zone B at the center, between the zones A and B, as a main insulation layer, as shown in FIG. 13. Consequently, as for impulse, the distribution of design stress in the zones A and C can be reduced by $\epsilon$-grading. As for DC, the distribution of design stress in the same zones A and C can be reduced by ρ-grading. Since the portion of insulation which get in contact with the conductor or the metal sheath may be usually electrically very vulnerable, it is extremely preferable to reduce the electrical stress distributions in these portions, as shown in FIG. 14.

In addition, as mentioned above, when the region just above the conductor where negative pressure may be produced when load is switched off is disposed with an insulation layer the resistivity of which is lower than the resistivity of a main insulation layer, stress is not distributed with this weak portion where negative pressure may be produced. Accordingly, this fact is further preferable for a solid cable.

Further, for example, when PPLP having the PP ratio of k=80% is disposed in the area in the insulation layer area close to the conductor, PPLP of k=60% is disposed in the next outer insulation layer area, and PPLP of k=40% is disposed in the further next outer insulation layer area, ρ-grading can be set to relieve DC stress in the insulation layer at the time of load ON and load OFF, because the resistivity ρ is normally larger as k is larger. Preferably, in this structure, when insulating oil the viscosity of which is indeed medium but as high as possible is to be used for some design conditions, the ratio of kraft paper in the insulation is higher and the oil flow resistance is smaller as the position in the cable goes toward the outside, so that impregnation can be performed relatively easily advantageously.

Although the cases using two or three kinds of insulating tapes were described above, more kinds of insulating tapes may be used for grading. In such a case, insulation can be designed more rationally, making an epoch-making advance in comparison with the conventional consideration on cables in which only one kind of insulating material could be used.

As described above, in the cable according to the present invention, the following effects can be obtained.

(1) It is possible to realize high temperature service operation and large capacity in a solid cable.

(2) There is no case that negative pressure is produced in an insulation layer near a conductor when load is switched off, so that the production of voids is restrained to prevent deterioration in electric performance.

(3) There is no fear that insulating oil leaks out of a cable end portion easily when the cable is cut and handled.

(4) By providing a reinforcing layer onto the metal sheath, it is possible to make the oil pressure inside the cable high, and there is no fear that a metal sheath is ruptured.

(5) In addition, in the solid cable manufacturing method according to the present invention, an insulation layer can be fully impregnated with insulating oil without lowering the productivity.

Further, in the transmission cable line according to the present invention, by providing SJ, a cable end portion can be prevented from being broken by the expansion of the insulating oil at the time of full load. In addition, by providing an oil feeding tank, the insulating oil can be supplied to a cable lying from a shore portion to a land portion, so that oil-starvation can be prevented from being produced.

Particularly, when the submarine-portion solid cable side of SJ and the oil feeding tank are connected through an oil feeding pipe and a check valve is provided in this oil feeding pipe, no only is possible to supply medium-viscosity insulating oil to the submarine-portion solid cable, but also it is possible to prevent the oil from backflow from the cable to the oil feeding thank.

What is claimed is:

1. An electrical power transmission cable having predetermined dielectric characteristics, the cable comprising:

a conductor; and an insulation layer provided on an outer circumference of said conductor, said insulation layer being impregnated with a medium viscosity insulating oil having a viscosity from 10 centistokes (cst) and less than 500 cst at 60° C.

2. A cable according to claim 1, wherein said insulation layer includes an insulating tape having a polyolefin resin film.

3. A cable according to claim 2, wherein said insulation layer comprises a compositive tape, said composite tape comprising a polypropylene film laminated with kraft paper on both sides thereof, and wherein a total thickness of said polypropylene resin film constitutes 40% to less than 90% of the total thickness of said composite tape.

4. A cable according to claim 2, wherein said insulation layer comprises a composite tape, said composite tape comprising a polyolefin resin film laminated with kraft paper on both sides thereof, and wherein a thickness ratio of a total thickness of said polyolefin resin film to the total thickness of said insulating tape selected so as to establish at least one of a resistivity (ρ) ρ-grading and a permittivity (ϵ) ϵgrading in said insulation layer.

5. A cable according to claim 1, further comprising:

a metal sheath provided on an outer circumference of said insulation layer; and a reinforcing layer formed on an outer circumference of said metal sheath that reinforces said metal sheath by absorbing hoop stress exerted on said metal sheath.

6. A cable according to claim 1, wherein said medium-viscosity insulating oil comprises mainly polybutene.

7. A cable according to claim 1, wherein said medium-viscosity insulating oil includes a solid type rubber having an average molecular weight from 50,000 amu to less than 2,000,000 amu.

8. A cable according to claim 7, wherein said solid type rubber comprises at least one of an isoprene rubber, a butadiene rubber, an isobutylene rubber, an ethylene-propylene rubber, and a polyisobutylene rubber.

9. A cable according to claim 7, wherein said medium-viscosity insulating oil is a mixture of a liquid type polybutene and said solid type rubber.

10. A cable according to claim 7, further comprising a ratio of said solid type rubber in said medium-viscosity insulating oil from 0.1 wt % to less than 8 wt %.

11. An electrical power transmission cable having predetermined dielectric characteristics, the cable comprising:

a conductor; and an insulation layer provided on an outer circumference of said conductor, said insulation layer being impregnated with a medium viscosity insulating oil having a viscosity from 10 centistokes (cst) to less than 500 cst at 60 ° C.;

said insulation layer comprising a composite tape, said composite tape comprising a polyolefin resin film laminated with kraft paper on both sides thereof; and said insulation layer further comprising an insulating tape, said insulating tape being a polyolefin resin film, wherein said composite tape and said insulating tape are wound to form said insulation layer.

12. An electrical power transmission cable having predetermined dielectric characteristics, the cable comprising:

a conductor; and an insulation layer provided on an outer circumference of said conductor, said insulation layer being impregnated with a medium viscosity insulating oil having a viscosity from 10 centistokes (cst) to less than 500 cst at 60° C, wherein said insulating layer includes an insulating tape having a polyolefin resin film, and wherein said insulating oil and said polyolefin resin film each have a solubility parameter value, said insulating oil solubility parameter value being a range of ±1.5 of the solubility parameter value of said polyolefin resin film.

13. An electrical power transmission cable system comprising:

a cable having predetermined dielectric characteristics, the cable including a conductor and an insulation layer provided on an outer circumference of said conductor, said insulation layer being impregnated with a medium viscosity insulating oil having a viscosity from 10 centistokes (cst) to less than 500 cst at 60° C., said cable having a submarine-portion and a land-position, said submarine-portion being adapted, constructed, and arranged such that it can be submerged under water;

an oil stop joint box that connects said submarine-portion to said land-portion; and an oil feeding tank connected to said land-portion that feeds one of said medium viscosity insulating oil and a lower viscosity insulating oil to said land-portion.

14. A cable system according to claim 13, further comprising:

an oil feeding pipe connected to said oil stop joint box at its submarine-portion cable side, said oil feeding pipe coupled to said oil feeding tank to feed said medium-viscosity insulating oil from said oil feeding tank to said submarine-portion cable.

15. A cable system according to claim 14, further comprising:

a check valve interposed along said oil feeding pipe between said oil feeding tank and said oil stop joint box to prevent backward flow of said medium-viscosity insulating oil from the submarine-portion cable to said oil feeding tank through said oil stop joint box.

16. An electrical power transmission cable having predetermined dielectric characteristics, the cable comprising:

a conductor; and an insulation layer provided on an outer circumference of said conductor, said insulation layer being impregnated with a medium viscosity insulating oil having a viscosity from 30 centistokes (cst) to less than 500 cst 60° C.

17. A cable according to claim 16, wherein said insulating layer includes an insulating tape having a polyolefin resin film.

18. A cable according to claim 17, wherein said insulating oil and said polyolefin resin film each have a solubility parameter value, said insulating oil solubility parameter value being in a range of ±1.5 of the solubility parameter value of said polyolefin resin film.

19. A cable according to claim 17, wherein said insulation layer comprises a composite tape, said composite tape comprising a polypropylene film, laminated with a kraft paper on both sides thereof, and wherein a total thickness of said polypropylene resin film constitutes from 40% to less than 90% of the total thickness of said composite tape.

20. A cable according to claim 17, wherein said insulation layer comprises a composite tape, said composite tape comprising a polyolefin resin film laminated with a kraft paper on both sides thereof, and wherein a thickness ratio of a total thickness of said polyolefin resin film to the total thickness of said insulating tape selected so as to establish at least one of resistivity (ρ) ρ-grading and a permittivity (ϵ) ϵ-grading in said insulation layer.

21. A cable according to claim 16, further comprising: a metal sheath provided on an outer circumference of said insulation layer; and a reinforcing layer formed on an outer circumference of said metal sheath that reinforces said metal sheath by absorbing hoop stress exerted on said metal sheath.

22. A cable according to claim 16, wherein said medium-viscosity insulating oil comprises mainly polybutene.

23. A cable according to claim 16, wherein said medium-viscosity insulating oil includes a solid type rubber having an average molecular weight from 50,000 amu to less than 2,000,000 amu.

24. A cable according to claim 23, wherein said solid tape rubber comprises at least one of an isoprene rubber, a butadiene rubber, an isobutylene rubber, an ethylene-propylene rubber, and polyisobutylene rubber.

25. A cable according to claim 23, wherein said medium-viscosity insulating oil is a mixture of a liquid type polybutene and said solid type rubber.

26. A cable according to claim 23, further comprising a ratio of said solid type rubber in said medium-viscosity insulating oil from 0.1 wt % to less than 8 wt %.

27. An electrical power transmission cable having predetermined dielectric characteristics, the cable comprising:

a conductor; and an insulation layer provided on an outer circumference of said conductor, said insulation layer being impregnated with a medium viscosity insulating oil having a viscosity from 30 centistokes (cst) to less than 500 cst at 60° C.;

said insulation layer comprising a composite tape, said composite tape comprising a polyolefin resin film laminated with kraft paper on both sides thereof; and said insulation layer further comprising an insulating tape, said insulating tape being a polyolefin resin film, wherein said composite tape and said insulating tape are wound to form said insulation layer.

28. An electrical power transmission cable system comprising:

a cable having predetermined dielectric characteristics, the cable including a conductor and an insulation layer provided on an outer circumference of said conductor, said insulation layer being impregnated with a medium viscosity insulating oil having a viscosity from 30 centistokes (cst) to less than 500 cst at 60° C., said cable having a submarine-portion and a land-portion, said submarine-portion being adapted, constructed, and arranged such that it can be submerged under water;

an oil stop joint box that connects said submarine-portion to said land-portion; and an oil feeding tank connected to said land-portion that feeds one of said medium viscosity insulating oil and a lower viscosity insulating oil to said land-portion.

29. A cable system according to claim 28, further comprising:

an oil feeding pipe connected to said oil stop joint box at its submarine-portion cable side, said oil feeding pipe coupled to said oil feeding to feed medium-viscosity insulating oil from said oil feeding to said submarine-portion cable.

30. A cable system according to claim 29, further comprising;

a check valve interposed along said oil feeding pipe between said oil feeding tank and said oil stop joint box to prevent a backward flow of said medium-viscosity insulating oil from the submarine-portion cable to said oil feeding tank through said oil stop joint box.

* * * * *